(12) United States Patent
Edelstein et al.

(10) Patent No.: US 9,620,481 B2
(45) Date of Patent: Apr. 11, 2017

(54) SUBSTRATE BONDING WITH DIFFUSION BARRIER STRUCTURES

(71) Applicant: GLOBALFOUNDRIES INC., Grand Cayman (KY)

(72) Inventors: Daniel C. Edelstein, White Plains, NY (US); Douglas C. La Tulipe, Jr., Guilderland, NY (US); Wei Lin, Albany, NY (US); Deepika Priyadarshini, Guilderland, NY (US); Spyridon Skordas, Wappingers Falls, NY (US); Tuan A. Vo, Albany, NY (US); Kevin R. Winstel, East Greenbush, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/716,300

(22) Filed: May 19, 2015

(65) Prior Publication Data

US 2015/0262976 A1    Sep. 17, 2015

Related U.S. Application Data

(62) Division of application No. 13/905,442, filed on May 30, 2013, now Pat. No. 9,064,937.

(51) Int. Cl.
*H01L 21/00* (2006.01)
*H01L 25/065* (2006.01)
(Continued)

(52) U.S. Cl.
CPC .... *H01L 25/0657* (2013.01); *H01L 21/76885* (2013.01); *H01L 21/76898* (2013.01);
(Continued)

(58) Field of Classification Search
CPC ......... H01L 24/08; H01L 24/09; H01L 24/80; H01L 2224/80895; H01L 2224/80001;
(Continued)

(56) References Cited

U.S. PATENT DOCUMENTS 8,071,474 B2    12/2011   Shimizu et al.
8,222,134 B2    7/2012    Gordon et al.
(Continued)

OTHER PUBLICATIONS

Usui, I. et al., "Highly Reliable Copper Dual-Damascene Interconnects with Self-Formed MnSixOy Barrier Layer", IEEE Transactions on Electron Devices (Oct. 2006) pp. 2492-2499, vol. 53, No. 10.*

(Continued)

*Primary Examiner* — Khiem D Nguyen
(74) *Attorney, Agent, or Firm* — Scully, Scott, Murphy & Presser, P.C.

(57) ABSTRACT

A metallic dopant element having a greater oxygen-affinity than copper is introduced into, and/or over, surface portions of copper-based metal pads and/or surfaces of a dielectric material layer embedding the copper-based metal pads in each of two substrates to be subsequently bonded. A dopant-metal silicate layer may be formed at the interface between the two substrates to contact portions of metal pads not in contact with a surface of another metal pad, thereby functioning as an oxygen barrier layer, and optionally as an adhesion material layer. A dopant metal rich portion may be formed in peripheral portions of the metal pads in contact with the dopant-metal silicate layer. A dopant-metal oxide portion may be formed in peripheral portions of the metal pads that are not in contact with a dopant-metal silicate layer.

16 Claims, 12 Drawing Sheets

(51) Int. Cl.
*H01L 21/768* (2006.01)
*H01L 23/532* (2006.01)
*H01L 23/00* (2006.01)
*H01L 25/00* (2006.01)
*H01L 23/48* (2006.01)

(52) U.S. Cl.
CPC ........ H01L 23/532 (2013.01); H01L 23/5329 (2013.01); H01L 23/53233 (2013.01); H01L 24/00 (2013.01); H01L 24/03 (2013.01); H01L 24/05 (2013.01); H01L 24/08 (2013.01); H01L 24/09 (2013.01); H01L 24/80 (2013.01); H01L 24/89 (2013.01); H01L 25/50 (2013.01); *H01L 21/76847* (2013.01); *H01L 21/76849* (2013.01); *H01L 21/76867* (2013.01); *H01L 23/481* (2013.01); *H01L 2224/03845* (2013.01); *H01L 2224/05007* (2013.01); *H01L 2224/0508* (2013.01); *H01L 2224/05147* (2013.01); *H01L 2224/05547* (2013.01); *H01L 2224/05576* (2013.01); *H01L 2224/05647* (2013.01); *H01L 2224/05686* (2013.01); *H01L 2224/08121* (2013.01); *H01L 2224/08145* (2013.01); *H01L 2224/08146* (2013.01); *H01L 2224/80009* (2013.01); *H01L 2224/80097* (2013.01); *H01L 2224/80357* (2013.01); *H01L 2224/80895* (2013.01); *H01L 2224/80896* (2013.01); *H01L 2225/06513* (2013.01); *H01L 2225/06541* (2013.01); *H01L 2924/0104* (2013.01); *H01L 2924/0105* (2013.01); *H01L 2924/01013* (2013.01); *H01L 2924/01022* (2013.01); *H01L 2924/01023* (2013.01); *H01L 2924/01024* (2013.01); *H01L 2924/01025* (2013.01); *H01L 2924/01026* (2013.01); *H01L 2924/01027* (2013.01); *H01L 2924/01041* (2013.01); *H01L 2924/01042* (2013.01); *H01L 2924/01072* (2013.01); *H01L 2924/01073* (2013.01); *H01L 2924/01074* (2013.01); *H01L 2924/01322* (2013.01); *H01L 2924/05442* (2013.01)

(58) Field of Classification Search
CPC . H01L 2224/80097; H01L 2224/08121; H01L 2224/08145; H01L 2224/08146; H01L 24/05; H01L 24/06
See application file for complete search history.

(56) References Cited

U.S. PATENT DOCUMENTS

| | | | |
|---|---|---|---|
| 2003/0157782 A1* | 8/2003 | Kellar | H01L 23/481 438/455 |
| 2004/0048459 A1* | 3/2004 | Patti | H01L 21/76898 438/612 |
| 2006/0220197 A1* | 10/2006 | Kobrinsky | H01L 21/76867 257/678 |
| 2008/0142990 A1* | 6/2008 | Yu | H01L 21/8221 257/777 |
| 2011/0049718 A1 | 3/2011 | Matsumoto et al. | |
| 2011/0084403 A1* | 4/2011 | Yang | H01L 24/03 257/777 |
| 2011/0163062 A1 | 7/2011 | Gordon et al. | |
| 2012/0061838 A1 | 3/2012 | Edelstein et al. | |
| 2012/0153484 A1 | 6/2012 | Sadaka | |
| 2013/0207268 A1* | 8/2013 | Chapelon | H01L 24/05 257/751 |
| 2014/0117546 A1* | 5/2014 | Liu | H01L 24/80 257/751 |

OTHER PUBLICATIONS

Usui, T. et al., "Highly Reliable Copper Dual-Damascene Interconnects with Self-Formed MnSixOy Barrier Layer" IEEE Transactions on Electron Devices (Oct. 2006) pp. 2492-2499, vol. 53, No. 10.

Lozano, J.G. et al., "Interdiffusion and Barrier Layer Formation in Thermally Evaporated Mn/Cu Heterostructures on SiO2 Substrates" Applied Physics Letters (Mar. 2011) pp. 123112-1-123112-3, vol. 98.

Tan, C. et al., "Three-Dimensional Wafer Stacking Using Cu—Cu Bonding for Simultaneous Formation of Electrical, Mechanical, and Hermetic Bonds" IEEE Transactions on Device and Materials Reliability (Jun. 2012) pp. 194-200, vol. 12, No. 2.

Enquist, P., "Scalable Direct Bond Technology and Applications Driving Adoption" Proc. 3D Systems Integration Conference (3DIC), 2011 IEEE International (Jan. 31, 2012-Feb. 2, 2012) pp. 1-5.

Peng, L. et al., "Thermal reliability of Fine Pitch Cu—Cu Bonding with Self Assembled Monolayer (SAM) Passivation for Wafer-on-Wafer 3D-Stacking" Proc. 2011 Electronic Components and Technology Conference (ECTC) (May 31, 2011-Jun. 3, 2011) pp. 22-26.

* cited by examiner

SUBSTRATE BONDING WITH DIFFUSION BARRIER STRUCTURES

BACKGROUND

This disclosure relates to bonded structures employing diffusion barrier structures derived from a metallic dopant element and methods of manufacturing the same.

Bonding of multiple substrates is required to enable three-dimensional integration of chips. Bonding of two substrates can be achieved by adhesion of two dielectric materials as in an oxide-to-oxide bonding that fuses silicon dioxide materials from two substrates during or after bonding, by adhesion between two metallic materials as in a copper-to-copper bonding that employs direct contact between opposing copper pads and a simultaneous or subsequent grain growth across the original interface between the opposing copper pads, or by a method employing a combination of the two adhesion mechanisms.

Lateral overlay variations during bonding of two substrates as well as vertical height variations of metal pads with respect to surrounding dielectric material layers can lead to contacts between metal pads and oxygen-permeable surfaces (such as silicon oxide surfaces) or physical exposure of peripheral surfaces of metal pads to an inter-substrate cavity. Such configurations provide path for copper migration/diffusion, and ingress path for oxygen or moisture into the metal pads and metal interconnect structures connected thereto, thereby degrading the reliability of the bonded structures.

SUMMARY

A metallic dopant element having a greater oxygen-affinity than copper is introduced into, and/or over, surface portions of copper-based metal pads and/or surfaces of a dielectric material layer embedding the copper-based metal pads in each of two substrates to be subsequently bonded. A dopant-metal silicate layer may be formed at the interface between the two substrates to contact portions of metal pads not in contact with a surface of another metal pad, thereby functioning as a barrier layer against copper and/or oxygen, and optionally as an adhesion material layer. A dopant metal rich portion may be formed in peripheral portions of the metal pads in contact with the dopant-metal silicate layer by segregation of the metallic dopants from copper in the metal pads. A dopant-metal oxide portion may be formed in peripheral portions of the metal pads that are not in contact with a dopant-metal silicate layer by segregation and oxidation of metallic dopants.

According to an aspect of the present disclosure, a bonded structure is provided, which includes a vertical stack of a first substrate and a second substrate. The first substrate includes a first silicon oxide layer embedding first metal pads predominantly including copper, and the second substrate includes a second silicon oxide layer embedding second metal pads predominantly including copper. Horizontal surfaces of the first metal pads are bonded to surfaces of the second metal pads at a plane of an interface. A metal silicate material is in physical contact with a peripheral portion of a surface of one of the first and second metal pads at the plane of the interface and adjoined to at least one of the first and second silicon oxide layers.

According to another aspect of the present disclosure, a bonded structure is provided, which includes a vertical stack of a first substrate and a second substrate. The first substrate includes a first silicon oxide layer embedding first metal pads predominantly including copper, and the second substrate includes a second silicon oxide layer embedding second metal pads predominantly including copper. Horizontal surfaces of the first metal pads are bonded to surfaces of the second metal pads. One of the first metal pads and one of the second metal pads are bonded to each other at an interface as a vertically contacting pair of metal pads. A metal oxide portion is embedded within a peripheral portion of a metal pad in the vertically contacting pair. The metal oxide portion includes an oxide of a dopant metal that is not present at a portion of the interface at which copper-containing material portions of metal pads are bonded to each other.

According to yet another aspect of the present disclosure, a method of bonding substrates is provided. A first substrate including first metal pads predominantly embedded in a first silicon oxide layer is provided. A second substrate including second metal pads predominantly embedded in a second silicon oxide layer is provided. A dopant metal is introduced into surface regions of at least one of the first substrate and the second substrate. The dopant metal is selected from elemental metals having a greater oxygen-affinity than copper. The first metal pads are bonded with the second metal pads. A compound including the dopant metal is formed in, or on, one of the first and second metal pads.

DETAILED DESCRIPTION

Figure 1A:
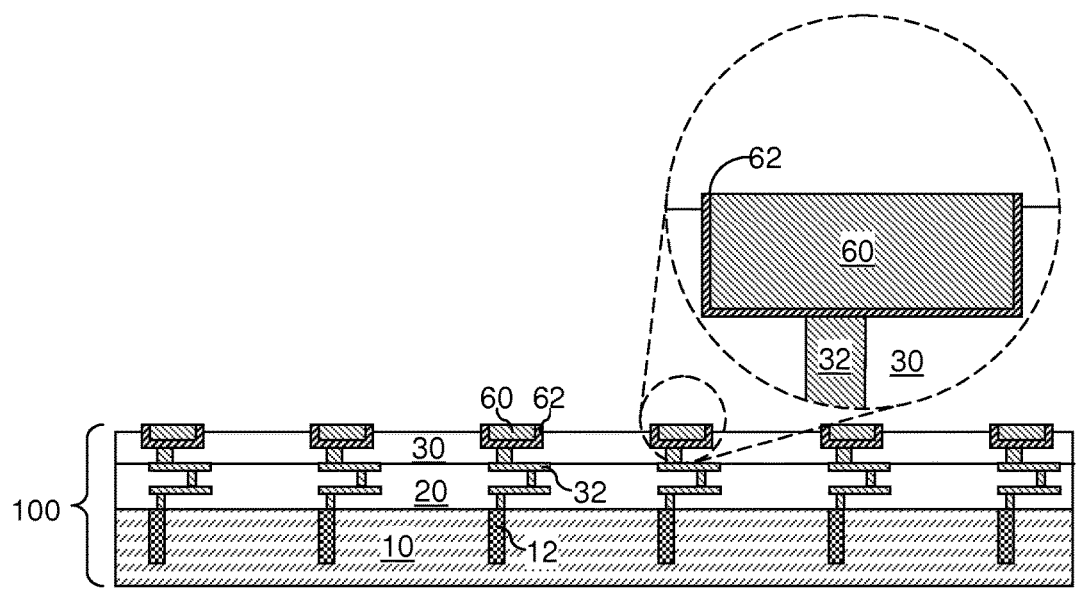
FIG. 1A is a vertical cross-sectional view of a first substrate as provided according to a first embodiment of the present disclosure.

As stated above, the present disclosure relates to bonded structures employing diffusion barrier structures derived from a metallic dopant element and methods of manufacturing the same. Aspects of the present disclosure are now described in detail with accompanying figures. It is noted that like and corresponding elements mentioned herein and illustrated in the drawings are referred to by like reference numerals. As used herein, ordinals such as "first" and "second" are employed merely to distinguish similar elements, and different ordinals may be employed to designate a same element in the specification and/or claims.

As used herein, a "metal" refers to any elemental metal in the Periodic Table of Elements.

As used herein, a "non-metal" refers to any element that is not an elemental metal in the Periodic Table of Elements.

As used herein, a "metallic material" is a material including at least one elemental metal. A metallic material may consist of an elemental metal, an intermetallic alloy of at least two elemental metals, or an alloy of at least one elemental metal and at least one non-metallic element.

As used herein, an "intermetallic alloy" is an alloy consisting of at least two elemental metals.

As used herein, a "metallic alloy" is a conductive alloy including at least one elemental metal and at least another element.

As used herein, "Lanthanides" includes element having an atomic number from 57 to 71.

As used herein, "Actinides" includes elements having an atomic number from 89 to 103.

Referring to FIG. 1, a first substrate 100 according to a first embodiment of the present disclosure includes a vertical stack of a first semiconductor substrate 10, first through-substrate via structures (TSV structures) 12 embedded in the first semiconductor substrate 10, first interconnect-level dielectric layers 20, and a first silicon oxide layer 30. The first interconnect-level dielectric layers 20 can include any dielectric material that can be employed to embed metal interconnect structures therein as known in the art. For example, the first interconnect-level dielectric layers 20 can include silicon oxide, silicon nitride, organosilicate glass (OSG), spin-on glass (SOG), etc. First metal interconnect structures 32 are embedded in the first interconnect-level dielectric layers 20 and the first silicon oxide layer 30. First metal pads (60, 62) are embedded within the first semiconductor oxide layer 32.

Each first metal pad (60, 62) can include a first copper-containing pad portion 60 and a first metallic nitride liner 62. The first copper-containing pad portions 60 predominantly include copper. As used herein, a structure predominantly includes copper if more than 50% of all atoms in the structure are copper atoms. In one embodiment, the first copper-containing pad portions 60 can include copper at an atomic concentration greater than 95%, and may optionally include aluminum. The first metallic nitride liners 62 include a metallic nitride such as TiN, TaN, WN. The thickness of the first metallic nitride liners 62 can be in a range from 3 nm to 60 nm, although lesser and greater thicknesses can also be employed. Each first metal pad (60, 62) predominantly includes copper.

The first silicon oxide layer 30 includes silicon oxide, which may be undoped silicate glass, or may include a doped silicate glass portion that is doped with F, P, B, or combinations thereof. The top surface of the first substrate 100 includes a top surface of the first silicon oxide layer 30 and top surfaces of the first metal pads (60, 62). The top surface of the first silicon oxide layer 30 may be coplanar with the top surfaces of the first metal pads (60, 62), or may be vertically recessed relative to the top surfaces of the first metal pads (60, 62), for example, by a recess distance greater than 0 nm and less than 30 nm, although greater recess distances can also be employed. Thus, a first substrate 100 including first metal pads (60, 62) predominantly including copper and embedded in a first silicon oxide layer 30 is provided.

Figure 1B:
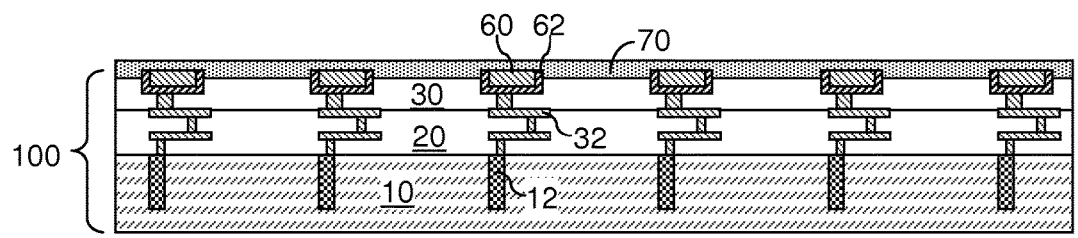
FIG. 1B is a vertical cross-sectional view of the first substrate after formation of a metal oxide layer according to the first embodiment of the present disclosure.

Referring to FIG. 1B, a first metal oxide layer 70 can be formed on the top surface of the first substrate 100. A dopant metal is introduced into surface regions of the first substrate 100. In one embodiment, the first metal oxide layer 70 can be formed by deposition of a dopant metal while the first substrate 100 is placed in an oxidizing ambient. In this case, a metal oxide material is deposited directly on the top surface of the first substrate 100 to form the first metal oxide layer 70. In another embodiment, the first metal oxide layer 70 can be formed by deposition of a dopant metal while the first substrate 100 is placed in a non-oxidizing ambient such that a metal layer is formed on the top surface of the first substrate 100. Subsequently, the metal layer is converted into the first metal oxide layer 70 by oxidation. In yet another embodiment, the first metal oxide layer 70 can be deposited by deposition of an oxide of a dopant metal. As used herein, a "dopant metal" refers to at least one elemental metal that is different from the metallic element that is predominantly present in the first metal pads (60, 62), i.e., at least one elemental metal that is different from copper.

The dopant metal can be selected elemental metals having a greater oxygen-affinity than copper. As used herein, an "oxygen-affinity" refers to the affinity to form a compound with oxygen as determined in Ellingham diagram for metal oxides as known in the art at the temperature of 300K. In one embodiment, the dopant metal does not form a eutectic compound with copper. In one embodiment, the dopant metal segregates from copper under a controlled temperature and ambient including a non-oxidizing ambient at an elevated temperature in a range from 100° C. to 600° C. As used herein, a non-oxidizing ambient refers to an ambient that does not oxidize copper or the dopant metal, or any metal that substitutes the dopant metal. In one embodiment, the dopant metal does not form a eutectic compound with copper or segregates from copper under a controlled temperature and ambient including a non-oxidizing ambient at an elevated temperature in a range from 100° C. to 600° C. In one embodiment, the dopant metal does not form a eutectic compound with copper and segregates from copper under a controlled temperature and ambient including a non-oxidizing ambient at an elevated temperature in a range from 100° C. to 600° C. In one embodiment, the dopant metal can be at least one elemental metal that is selected from Ti, V, Cr, Mn, Fe, Co, Ni, Zr, Nb, Mo, Lanthanides, Hf, Ta, W, Actinides, Al, and Sn. In one embodiment, the dopant metal can be selected from Ti, V, Cr, Mn, Fe, Co, Ni, Zr, Nb, Mo, Lanthanides, Hf, Ta, W, and Actinides. In another embodiment, the dopant metal can be selected from Al and Sn. In yet another embodiment, the dopant metal can be selected from Mn and Nb. The thickness of the first metal oxide layer 70 can be from 1 nm to 50 nm, although lesser and greater thicknesses can also be employed.

In an illustrative example, the first metal oxide layer 70 can be a layer of manganese oxide, which can be deposited by chemical vapor deposition. The layer of manganese oxide may be deposited non-selectively, or can be deposited with selectivity such that the thickness of the deposited manganese oxide material on the surface of the first silicon oxide layer 30 is greater than the thickness of the deposited manganese oxide material on the surface of the first metal pads (60, 62).

Figure 1C:
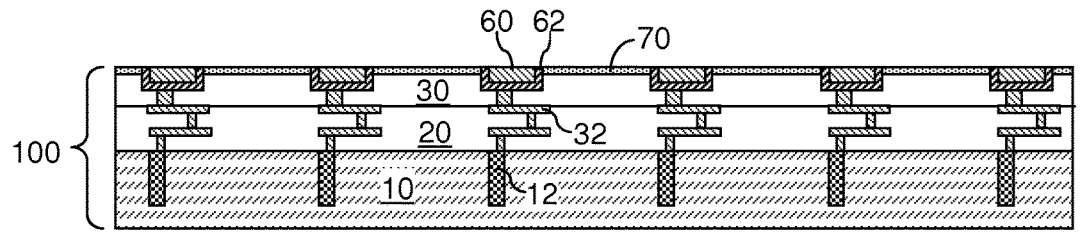
FIG. 1C is a vertical cross-sectional view of the first substrate after a touch-up chemical mechanical planarization (CMP) according to the first embodiment of the present disclosure.

Referring to FIG. 1C, a touch-up chemical mechanical planarization (CMP) is performed to remove the first metal oxide layer 70 from above the first metal pads (60, 62). Remaining portions of the first metal oxide layer 70 are present above the top surface of the first silicon oxide layer 30. The thickness of the first metal oxide layer 70 above the top surface of the first silicon oxide layer 30 after planarization can be in a range from 0.5 nm to 30 nm, although lesser and greater thicknesses can also be employed.

Figure 1D:
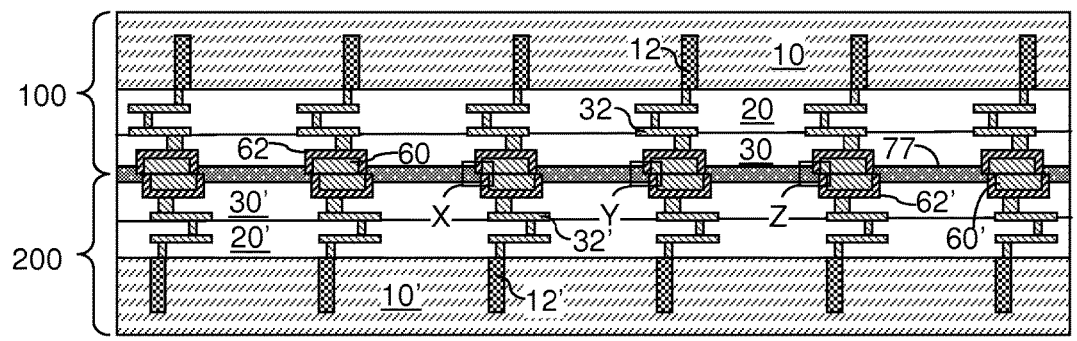
FIG. 1D is a vertical cross-sectional view of a first bonded structure in which the first substrate is bonded with a second substrate according to the first embodiment of the present disclosure.

Referring to FIG. 1D, a second substrate 200 is provided. In one embodiment, the second substrate 200 can include a vertical stack of a second semiconductor substrate 10', second through-substrate via structures (TSV structures) 12' embedded in the second semiconductor substrate 10', second interconnect-level dielectric layers 20', and a second silicon oxide layer 30'. The second interconnect-level dielectric layers 20' can include any dielectric material that can be employed to embed metal interconnect structures therein as known in the art. Second metal interconnect structures 32' are embedded in the second interconnect-level dielectric layers 20' and the second silicon oxide layer 30'. Second metal pads (60', 62') are embedded within the second semiconductor oxide layer 32'. The second substrate 200 includes second metal pads (60', 62') predominantly embedded in the second silicon oxide layer 30'.

Each second metal pad (60', 62') can include a second copper-containing pad portion 60' and a second metallic nitride liner 62'. The second copper-containing pad portions 60' predominantly include copper. In one embodiment, the second copper-containing pad portions 60' can include copper at an atomic concentration greater than 95%, and may optionally include aluminum. The second metallic nitride liners 62' include a metallic nitride such as TiN, TaN, WN. The thickness of the second metallic nitride liners 62' can be in a range from 3 nm to 60 nm, although lesser and greater thicknesses can also be employed. Each second metal pad (60', 62') predominantly includes copper.

The second silicon oxide layer 30' includes silicon oxide, which may be undoped silicate glass, or may include a doped silicate glass portion that is doped with F, P, B, or combinations thereof. The top surface of the second substrate 100 includes a top surface of the second silicon oxide layer 30 and top surfaces of the second metal pads (60', 62'). The top surface of the second silicon oxide layer 30 may be coplanar with the top surfaces of the second metal pads (60', 62'), or may be vertically recessed relative to the top surfaces of the second metal pads (60', 62'), for example, by a recess distance greater than 0 nm and less than 30 nm, although greater recess distances can also be employed. Thus, a second substrate 200 including second metal pads (60', 62') predominantly including copper and embedded in a second silicon oxide layer 30 is provided.

In one embodiment, a dopant metal is introduced into surface regions of the second substrate 200. The dopant metal introduced into surface regions of the second substrate 200 can be the same as, or can be different from, the dopant metal introduced into surface regions of the first substrate 100.

In one embodiment, processing steps of FIGS. 1B and 1C can be formed to introduce the dopant metal into surface regions of the second substrate 200, i.e., by formation of a second metal oxide layer. The composition and thickness of the second metal oxide layer after planarization can be the same the composition and thickness of the first metal oxide layer 70. Alternately, the second substrate 200 can be provided employing any of the processing steps employed to form a first substrate 100 according to second through fifth embodiments of the present disclosure as described below.

In another embodiment, introduction of a dopant metal into surface regions of the second substrate 200 may be omitted. In this case, the processing steps of FIGS. 1B and 1C or equivalent processing steps in the second through fifth embodiments of the present disclosure can be omitted for the second substrate 200.

The second substrate 200 can include all of the elements of the first substrate 100 of FIG. 1C, or can be the same as any of the first substrates 100 immediately before bonding according to second, third, fourth, and fifth embodiments of the present disclosure as described below.

The first substrate 100 and the second substrate 200 are brought into contact with each other such that physically exposed horizontal surfaces of the first metal pads (60, 62) contact physically exposed horizontal surfaces of the second metal pads (60', 62'). A bonded structure including the first substrate 100 and the second substrate 200 is formed by annealing the stack of the first substrate 100 and the second substrate 200 while the first metal pads (60, 62) are in contact with the second metal pads (60'. 62'), thereby inducing copper-to-copper bonding between the first metal pads (60, 62) and the second metal pads (60', 62'). Vertically contacting pairs of a first metal pad (60, 62) and a second metal pad (60', 62') is formed within the bonded structure including the first and second substrates (100, 200). A first bonded structure illustrated in FIG. 1D can be formed by employing the first substrate 100 illustrated in FIG. 1C and a second substrate 200 formed by methods illustrated in FIGS. 1A-1C. Variations are expressly contemplated herein in which the second substrate 200 is obtained by one of the methods of the second through fifth embodiments (as described below).

As the first metal pads (60, 62) are bonded with the second metal pads (60', 62'), a compound including the dopant metal is formed on the first metal pads (60, 62) and/or the second metal pads (60', 62'). The first bonded structure includes a vertical stack of the first substrate 100 and the second substrate 200. The first substrate 100 includes a first silicon oxide layer 30 embedding first metal pads (60, 62) predominantly including copper. The second substrate 200 includes a second silicon oxide layer 30' embedding second metal pads (60', 62') predominantly including copper. Horizontal surfaces of the first metal pads (60, 62) are bonded to surfaces of the second metal pads (60', 62') at a plane of an interface.

The compound including the dopant metal(s) in the first metal oxide layer 70 and/or a second metal oxide layer provided on the second substrate 200 is formed between the first substrate 100 and the second substrate 200. In one embodiment, the compound is a metal silicate material that is in physical contact with at least one of the first and second silicon oxide layers (30, 30') and with at least one of the first and second metal pads (60, 62, 60', 62'). In one embodiment, the metal silicate material can contact a horizontal surface of one of the first and second metal pads (60, 62, 60', 62') and a sidewall surface of another of the first and second metal pads (60, 62, 60', 62').

Figure 1E:
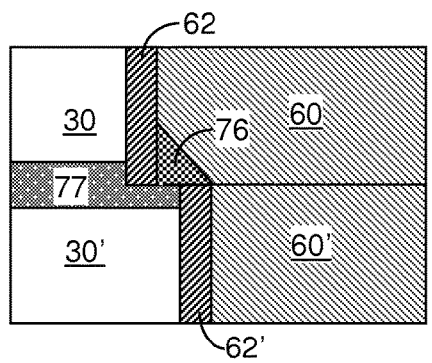
FIG. 1E is a magnified view of the region X in the first bonded structure of FIG. 1D.
Figure 1F:
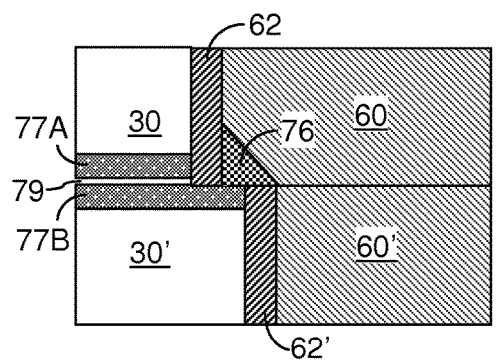
FIG. 1F is a magnified view of the region Y in the first bonded structure of FIG. 1D.
Figure 1G:
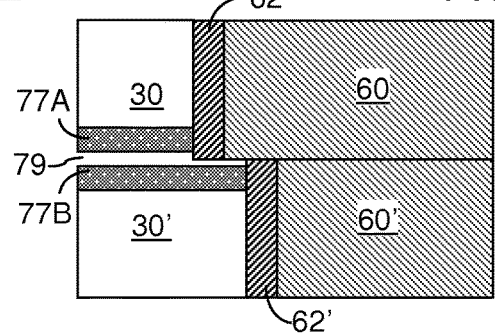
FIG. 1G is a magnified view of the region Z in the first bonded structure of FIG. 1D.

The first metal oxide layer 70 and an optional second metal oxide layer (that may be provided on the second substrate 200 prior to bonding) are transformed into a metal silicate material layer 77 as illustrated in FIG. 1E, or a pair of metal silicate material layers (77A, 77B) as illustrated in FIGS. 1F and 1G, depending on the microscopic geometry at the interface between the first and second substrates (100, 200). A metal silicate material including the dopant metal in the first metal oxide layer 70 and/or a dopant metal provided in a second metal oxide layer on the second substrate 200 is formed in the metal silicate material layer(s) (77, 77A, 77B) by reaction of the metal oxide material(s) with the underlying silicon oxide materials in the first and/or second silicon oxide layers (30, 30') during the anneal that bonds the first and second substrates (100, 200). The metal silicate material is a silicate of the dopant metal in the first metal oxide layer 70 and/or the dopant metal in the second metal oxide layer on the second substrate 200 prior to bonding. Thus, the metal silicate material is a silicate material of at least one elemental metal having a greater oxygen-affinity than copper. In one embodiment, the at least one elemental metal does not form a eutectic compound with copper. In one embodiment, the at least one elemental metal segregates from copper under a controlled temperature and ambient including a non-oxidizing ambient at an elevated temperature in a range from 100° C. to 600° C. In one embodiment, the at least one elemental metal does not form a eutectic compound with copper or segregates from copper under a controlled temperature and ambient including a non-oxidizing ambient at an elevated temperature in a range from 100° C. to 600° C. In one embodiment, the at least one elemental metal does not form a eutectic compound with copper and segregates from copper under a controlled temperature and ambient including a non-oxidizing ambient at an elevated temperature in a range from 100° C. to 600° C.

In each region including a vertically contacting pair of a first metal pad (60, 62) and a second metal pad (60', 62'), the metal silicate material is in physical contact with a peripheral portion of a surface of a first metal pad (60, 62) or a second metal pad (60', 62') at a plane of the interface between the first metal pad (60, 62) and the second metal pad (60', 62'). Further, the metal silicate material is adjoined to at least one of the first and second silicon oxide layers (30, 30'). The metal silicate material is in contact with a surface of a metallic nitride liner (62, 62') laterally surrounding the one of the first and second metal pads (60, 62, 60', 62').

The dopant metal in the metal silicate material can diffuse through the interface between the metal silicate material layers (77, 77A, 77B) and a metal pad (60, 62, 60', 62'), and a dopant metal rich portion 76 can be formed in the metal pad (60, 62, 60', 62'). In this case, the peripheral portion of the surface at which a metal silicate material layer (77, 77A, 77B) contacts a metal pad (60, 62, 60', 62') can be a surface of a dopant metal rich portion 76 within a metal pad (60, 62, 60', 62'). Each dopant metal rich portion 76 includes copper and at least one metallic element that is present within the metal silicate material. In one embodiment, the dopant metal rich portions 76 can include a region in which the dopant metal is a predominant element, i.e., more than 50% of all atoms in the region is the dopant metal. Each dopant metal rich portion 76 is formed within the one of the first and second metal pads (60, 62, 60', 62') underneath the horizontal surface by diffusion of the dopant metal into the one of the first and second metal pads (60, 62, 60', 62'). The metallic silicate material can contiguously extend between a pair of metal pads (60, 62, 60', 62') embedded within a same substrate that is selected from the first substrate and the second substrate (100, 200).

Referring to FIG. 1E, a magnified view of the region X in the first bonded structure of FIG. 1D is shown. The first metal oxide layer 70, or a combination of the first metal oxide layer 70 and a second metal oxide layer on the second substrate 200, can be converted into a metal silicate material layer 77. The metal silicate material layer 77 laterally contacts a vertical stack of a first metal pad (60, 62) and a second metal pad (60', 62') without forming any cavity (i.e., a gap) between the first substrate 100 and the second substrate 200. The metal silicate material is in physical contact with a horizontal surface of the first silicon oxide layer 30 and a surface of the second silicon oxide layer 30'.

Referring to FIG. 1F, a magnified view of the region Y in the first bonded structure of FIG. 1D is shown. The first metal oxide layer 70 can be converted into a first metal silicate material layer 77A. If a second metal oxide layer is provided on the second substrate 200, the second metal oxide layer can be converted into a second metal silicate material layer 77B. The first metal silicate material layer 77A, and the optional second metal silicate material layer 77B, can laterally contact a vertical stack of a first metal pad (60, 62) and a second metal pad (60', 62') with a cavity 79 in contact with the vertical stack of the two metal pads (60, 62, 60', 62') between the first substrate 100 and the second substrate 200. The metal silicate material is in physical contact with a horizontal surface of one of the first and second silicon oxide layers (30, 30'), and does not contact another of the first and second silicon oxide layers (30', 30).

Referring to FIG. 1G, a magnified view of the region Z in the first bonded structure of FIG. 1D is shown. The first metal oxide layer 70 can be converted into a first metal silicate material layer 77A. If a second metal oxide layer is provided on the second substrate 200, the second metal oxide layer can be converted into a second metal silicate material layer 77B. The bonded structure including the first and second substrates (100, 200) is formed with a cavity 79 laterally extending to a vertically contacting pair of a first metal pad (60, 62) and a second metal pad (60', 62'). The first metal silicate material layer 77A, and the optional second metal silicate material layer 77B, can laterally contact a vertical stack of a first metal pad (60, 62) and a second metal pad (60', 62') with a cavity 79 in contact with the vertical stack of the two metal pads (60, 62, 60', 62') between the first substrate 100 and the second substrate 200. The metal silicate material is not in physical contact with any horizontal surface of one of the first and second silicon oxide layers (30, 30'). The metal silicate material is present in each of the first metal silicate material layer 77A and the second metal silicate material layer 77B. The metal silicate material of the first metal silicate material layer 77A does not contact the second silicon oxide layer 30', and the metal silicate material of the second metal silicate material layer 77B does not contact the first silicon oxide layer 30.

Figure 2A:
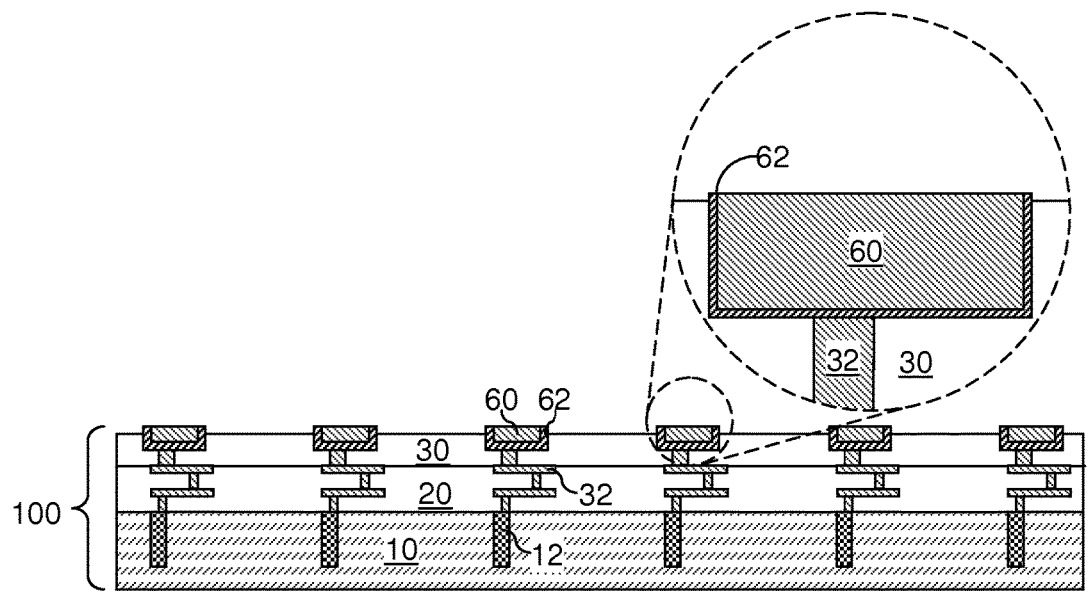
FIG. 2A is a vertical cross-sectional view of a first substrate as provided according to a second embodiment of the present disclosure.

Referring to FIG. 2A, a first substrate 100 according to a second embodiment of the present disclosure can be the same as the first substrate 100 in FIG. 1A of the first embodiment.

Figure 2B:
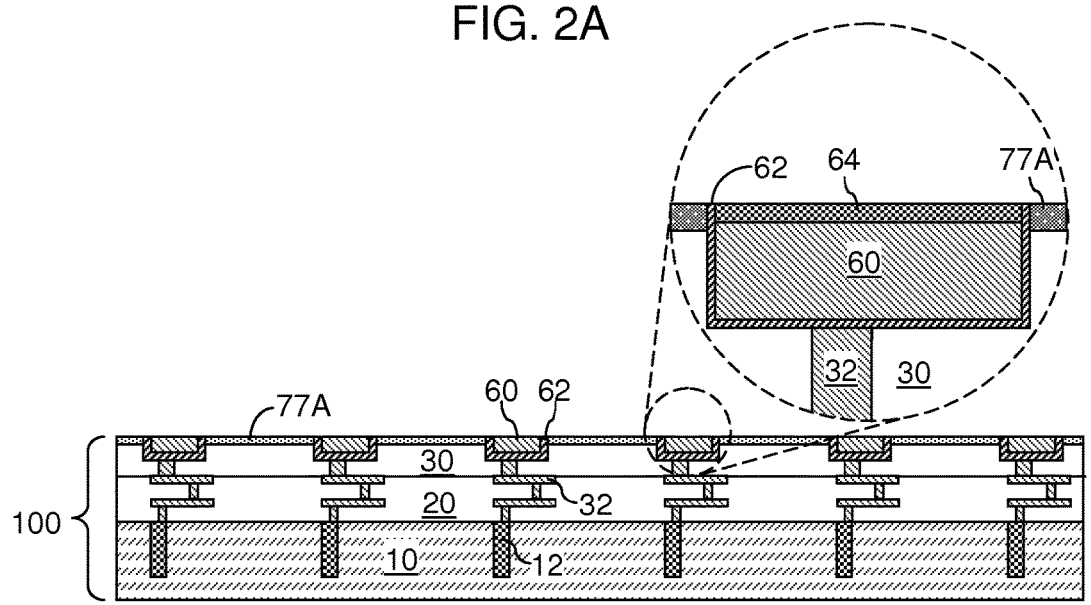
FIG. 2B is a vertical cross-sectional view of the first substrate after introduction of a dopant metal at an elevated temperature and in an oxygen-free environment according to the second embodiment of the present disclosure.

Referring to FIG. 2B, a dopant metal is introduced to surface portions of the first substrate 100 by deposition of the dopant metal at an elevated temperature and in an oxygen-free environment. As used herein, an elevated temperature refers to any temperature greater than 300K. In one embodiment, the elevated temperature can be, for example, in a range from 200° C. to 800° C. As used herein, an "oxygen-free environment" refers to an environment that includes less oxygen than is needed to cause oxidation of the dopant metal as determined by Ellingham diagram and oxidation kinetics. The dopant metal can be deposited, for example, by physical vapor deposition (PVD). An upper portion of each first copper-containing pad portions 60 is converted into a first doped copper region 64, which includes an alloy of copper and the dopant metal. A first metal silicate layer 77A is formed by an interfacial reaction of silicon oxide and the deposited dopant metal over the remaining portion of the first silicon oxide layer 30.

The dopant metal can be selected elemental metals having a greater oxygen-affinity than copper. In one embodiment, the dopant metal does not form a eutectic compound with copper. In one embodiment, the dopant metal segregates from copper under a controlled temperature and ambient including a non-oxidizing ambient at an elevated temperature in a range from 100° C. to 600° C. In one embodiment, the dopant metal does not form a eutectic compound with copper or segregates from copper under a controlled temperature and ambient including a non-oxidizing ambient at an elevated temperature in a range from 100° C. to 600° C. In one embodiment, the dopant metal does not form a eutectic compound with copper and segregates from copper under a controlled temperature and ambient including a non-oxidizing ambient at an elevated temperature in a range from 100° C. to 600° C. In one embodiment, the dopant metal can be at least one elemental metal that is selected from Ti, V, Cr, Mn, Fe, Co, Ni, Zr, Nb, Mo, Lanthanides, Hf, Ta, W, Actinides, Al, and Sn. In one embodiment, the dopant metal can be selected from Ti, V, Cr, Mn, Fe, Co, Ni, Zr, Nb, Mo, Lanthanides, Hf, Ta, W, and Actinides. In another embodiment, the dopant metal can be selected from Al and Sn. In yet another embodiment, the dopant metal can be selected from Mn and Nb.

The thickness of each first doped copper region 64 can be from 1 nm to 10 nm, although lesser and greater thicknesses can also be employed. The thickness of the first metal silicate layer 77A can be in a range from 1 nm to 10 nm, although lesser and greater thicknesses can also be employed. A touch-up CMP can be used to planarize (or dish, when needed) the surface of 64 relative to the surrounding 77A.

Figure 2C:
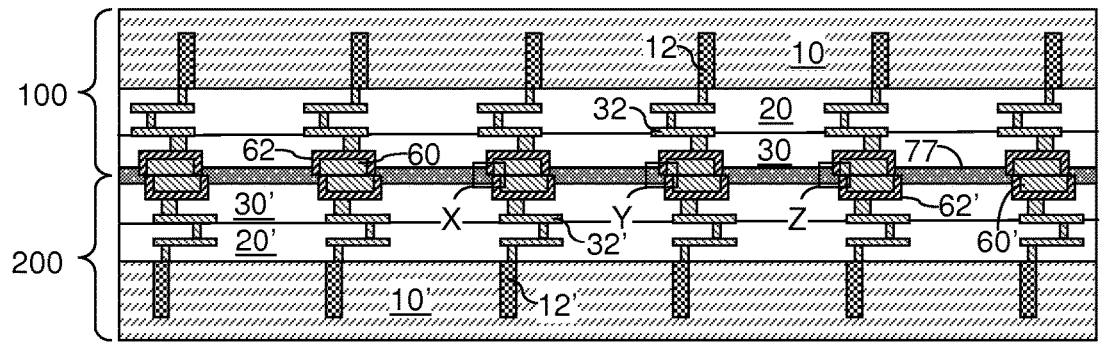
FIG. 2C is a vertical cross-sectional view of a second bonded structure in which the first substrate is bonded with a second substrate according to the second embodiment of the present disclosure.

Referring to FIG. 2C, a second substrate 200 is provided. The second substrate 200 can include all of the elements in the first substrate 100 in FIG. 2B, or can be the same as any of the first substrates 100 immediately before bonding according to the first, third, fourth, or fifth embodiments of the present disclosure.

In one embodiment, processing steps of FIG. 2B can be formed to introduce the dopant metal into surface regions of the second substrate 200, i.e., by formation of second doped copper regions on second copper-containing pad portions 60' and by formation of a second metal silicate layer. Alternately, the second substrate 200 can be provided employing any of the processing steps employed to form a first substrate 100 according to first, third, fourth, and fifth embodiments of the present disclosure.

In another embodiment, introduction of a dopant metal into surface regions of the second substrate 200 may be omitted. In this case, the processing steps of FIG. 2B or equivalent processing steps in the first, third, fourth, and fifth embodiments of the present disclosure can be omitted for the second substrate 200.

The first substrate 100 and the second substrate 200 are brought into contact with each other such that physically exposed horizontal surfaces of the first metal pads (60, 62) contact physically exposed horizontal surfaces of the second metal pads (60', 62'). A bonded structure including the first substrate 100 and the second substrate 200 is formed by annealing the stack of the first substrate 100 and the second substrate 200 while the first metal pads (60, 62) are in contact with the second metal pads (60'. 62'), thereby inducing copper-to-copper bonding between the first metal pads (60, 62) and the second metal pads (60', 62'). Vertically contacting pairs of a first metal pad (60, 62) and a second metal pad (60', 62') is formed within the bonded structure including the first and second substrates (100, 200). A second bonded structure illustrated in FIG. 2C can be formed by employing the first substrate 100 illustrated in FIG. 2B and a second substrate 200 formed by methods illustrated in FIGS. 2A and 2B. Variations are expressly contemplated herein in which the second substrate 200 is obtained by one of the methods of the first, third, fourth, and fifth embodiments.

As the first metal pads (60, 62) are bonded with the second metal pads (60', 62'), a compound including the dopant metal is formed on the first metal pads (60, 62) and/or the second metal pads (60', 62'). The first bonded structure includes a vertical stack of the first substrate 100 and the second substrate 200. The first substrate 100 includes a first silicon oxide layer 30 embedding first metal pads (60, 62) predominantly including copper. The second substrate 200 includes a second silicon oxide layer 30' embedding second metal pads (60', 62') predominantly including copper. Horizontal surfaces of the first metal pads (60, 62) are bonded to surfaces of the second metal pads (60', 62') at a plane of an interface.

The compound including the material(s) the first metal silicate layer 77A and/or a second metal silicate layer provided on the second substrate 200 is formed between the first substrate 100 and the second substrate 200. In one embodiment, the compound is a metal silicate material that is in physical contact with at least one of the first and second silicon oxide layers (30, 30') and with at least one of the first and second metal pads (60, 62, 60', 62'). In one embodiment, the metal silicate material can contact a horizontal surface of one of the first and second metal pads (60, 62, 60', 62') and a sidewall surface of another of the first and second metal pads (60, 62, 60', 62').

Figure 2D:
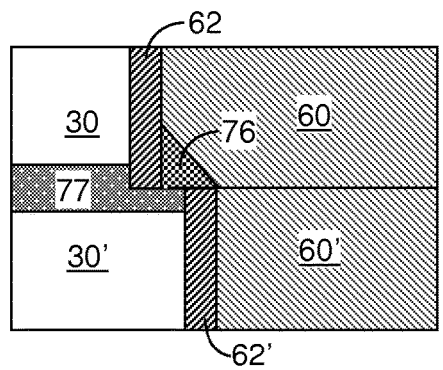
FIG. 2D is a magnified view of the region X in the second bonded structure of FIG. 2D.
Figure 2E:
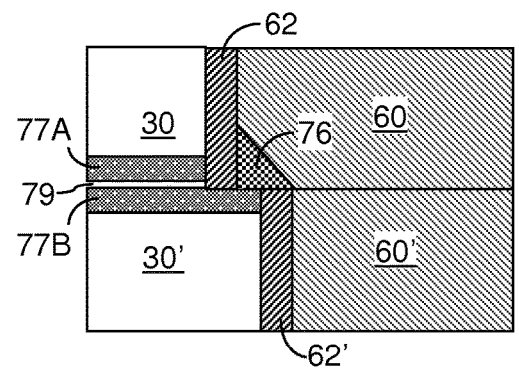
FIG. 2E is a magnified view of the region Y in the second bonded structure of FIG. 2D.
Figure 2F:
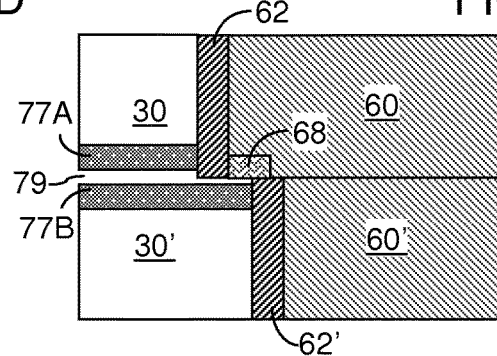
FIG. 2F is a magnified view of the region Z in the second bonded structure of FIG. 2D.

After bonding, the first metal silicate layer 77A and an optional second metal silicate layer (that may be provided on the second substrate 200 prior to bonding) are herein referred to as a metal silicate material layer 77 as illustrated in FIG. 2D, or a pair of metal silicate material layers (77A, 77B) as illustrated in FIGS. 2E and 2F, depending on the microscopic geometry at the interface between the first and second substrates (100, 200). A metal silicate material including the dopant metal and/or a dopant metal provided in a second metal oxide layer on the second substrate 200 is formed in the metal silicate material layer(s) (77, 77A, 77B) by reaction of the metal oxide material(s) with the underlying silicon oxide materials in the first and/or second silicon oxide layers (30, 30') during the anneal that bonds the first and second substrates (100, 200). The metal silicate material is a silicate material of at least one elemental metal having a greater oxygen-affinity than copper. In one embodiment, the at least one elemental metal does not form a eutectic compound with copper. In one embodiment, the at least one elemental metal segregates from copper under a controlled temperature and ambient including a non-oxidizing ambient at an elevated temperature in a range from 100° C. to 600° C. In one embodiment, the at least one elemental metal does not form a eutectic compound with copper or segregates from copper under a controlled temperature and ambient including a non-oxidizing ambient at an elevated temperature in a range from 100° C. to 600° C. In one embodiment, the at least one elemental metal does not form a eutectic compound with copper and segregates from copper under a controlled temperature and ambient including a non-oxidizing ambient at an elevated temperature in a range from 100° C. to 600° C.

In each region including a vertically contacting pair of a first metal pad (60, 62) and a second metal pad (60', 62'), the metal silicate material is in physical contact with a peripheral portion of a surface of a first metal pad (60, 62) or a second metal pad (60', 62') at a plane of the interface between the first metal pad (60, 62) and the second metal pad (60', 62'). Further, the metal silicate material is adjoined to at least one of the first and second silicon oxide layers (30, 30'). The metal silicate material is in contact with a surface of a metallic nitride liner (62, 62') laterally surrounding the one of the first and second metal pads (60, 62, 60', 62').

During the anneal that bonds the first and second substrates (100, 200), the dopant metal in the metal pads (60, 62, 60', 62') diffuses toward the interface between the metal pads (60, 62, 60', 62') and toward the metallic nitride liners (62, 62'), and forms dopant metal rich portions 76. In one embodiment, the separation of the dopant metals from copper can be due to the inability to form eutectics between copper and the dopant metal and/or the higher affinities of the dopant metals to oxygen and/or the dielectric material (30,30') than copper, and the elevated temperature during the anneal (which is typically in a range from 200° C. to 500° C.) enables/accelerates the separation of the dopant metal from the copper matrix of the first and second copper-containing pad portions (60, 60'). Further, the metallic nitride liners (62, 62') attract the dopant metal, thereby causing a pile-up of the dopant metal near the surfaces of the metallic nitride liners (62, 62'). In one embodiment, the dopant metal rich portions 76 can include a region in which the dopant metal is a predominant element, i.e., more than 50% of all atoms in the region is the dopant metal. In this case, the peripheral portion of the surface at which a metal silicate material layer (77, 77A, 77B) contacts a metal pad (60, 62, 60', 62') can be a surface of a dopant metal rich portion 76 within a metal pad (60, 62, 60', 62'). Each dopant metal rich portion 76 includes copper and at least one metallic element that is present within the metal silicate material. Each dopant metal rich portion 76 is formed within the one of the first and second metal pads (60, 62, 60', 62') underneath the horizontal surface by diffusion of the dopant metal into the one of the first and second metal pads (60, 62, 60', 62'). The metallic silicate material can contiguously extend between a pair of metal pads (60, 62, 60', 62') embedded within a same substrate that is selected from the first substrate and the second substrate (100, 200).

Referring to FIG. 2D, a magnified view of the region X in the first bonded structure of FIG. 2C is shown. The combination of the first metal silicate material layer 77A and the second metal silicate material layer 77B can be converted into a metal silicate material layer 77. The metal silicate material layer 77 laterally contact a vertical stack of a first metal pad (60, 62) and a second metal pad (60', 62') without forming any cavity (i.e., a gap) between the first substrate 100 and the second substrate 200. The metal silicate material is in physical contact with a horizontal surface of the first silicon oxide layer 30 and a surface of the second silicon oxide layer 30'.

Referring to FIG. 2E, a magnified view of the region Y in the first bonded structure of FIG. 2C is shown. The first metal silicate material layer 77A and the optional second metal silicate material layer 77B remain as separate layers. The first metal silicate material layer 77A, and the optional second metal silicate material layer 77B, can laterally contact a vertical stack of a first metal pad (60, 62) and a second metal pad (60', 62') with a cavity 79 in contact with the vertical stack of the two metal pads (60, 62, 60', 62') between the first substrate 100 and the second substrate 200. The metal silicate material is in physical contact with a horizontal surface of one of the first and second silicon oxide layers (30, 30'), and does not contact another of the first and second silicon oxide layers (30, 30').

Referring to FIG. 2F, a magnified view of the region Z in the first bonded structure of FIG. 2C is shown. The first metal silicate material layer 77A and the optional second metal silicate material layer 77B remain as separate layers. The first metal silicate material layer 77A and the second metal silicate material layer 77B can laterally contact a vertical stack of a first metal pad (60, 62) and a second metal pad (60', 62') with a cavity 79 therebetween. The metal silicate material is not in physical contact with any horizontal surface of one of the first and second silicon oxide layers (30, 30'). The metal silicate material is present in each of the first metal silicate material layer 77A and the second metal silicate material layer 77B. The metal silicate material of the first metal silicate material layer 77A does not contact the second silicon oxide layer 30', and the metal silicate material of the second metal silicate material layer 77B does not contact the first silicon oxide layer 30.

A metal oxide portion 68 can be formed within a peripheral portion of a metal pad (60, 62, 60', 62') in the vertically contacting pair that is physically exposed to the cavity 79 such that the metal oxide portion 68 includes an oxide of the dopant metal. Specifically, in a vertically contacting pair of metal pads (60, 62, 60', 62'), a first metal pad (60, 62) and a second metal pad (60', 62') can be bonded to each other at an interface such that a horizontal surface of one of the copper-containing pad portions (60, 60') is physically exposed to a cavity 79. The dopant metal can migrate to the physically exposed surface of the copper-containing pad portions (60 or 60') and form an oxide of the dopant metal. Each portion of the metal pad including the oxide of the dopant metal constitutes a metal oxide portion 68. The ambient during the anneal that bonds the first and second substrates (100, 200) is controlled such that the dopant metal is oxidized to form the metal oxide portions 68 while preventing conversion of copper into copper oxide. Each metal oxide portion 68 is embedded within a peripheral portion of a metal pad in the vertically contacting pair. The dopant metal is not present at a center portion of the interface between the copper-containing pad portions (60 or 60') because the dopant metal migrates toward the metallic nitride liners (62, 62') and the surrounding dielectric. In this case, the metal oxide portion 68 includes an oxide of a dopant metal that is not present at a portion of the interface at which copper-containing material portions (60, 60') of metal pads are bonded to each other. In one embodiment, a horizontal surface of the metal oxide portion 68 can be coplanar with the interface.

In one embodiment, each metal pad in the vertically contacting pair of metal pads (60, 62, 60', 62') can be physically exposed to a cavity 79 by which a horizontal surface of the first silicon oxide layer 30 is spaced from a horizontal surface of the second silicon oxide layer 30'. In one embodiment, the first metal pad (60, 62) in the vertically contacting pair includes a first metallic nitride liner 62, a second metal pad (60', 62') in the vertically contacting pair includes a second metallic nitride liner 62', and the metal oxide portion 68 can be in contact with the first metallic nitride liner 62 and the second metallic nitride liner 62'.

Figure 3A:
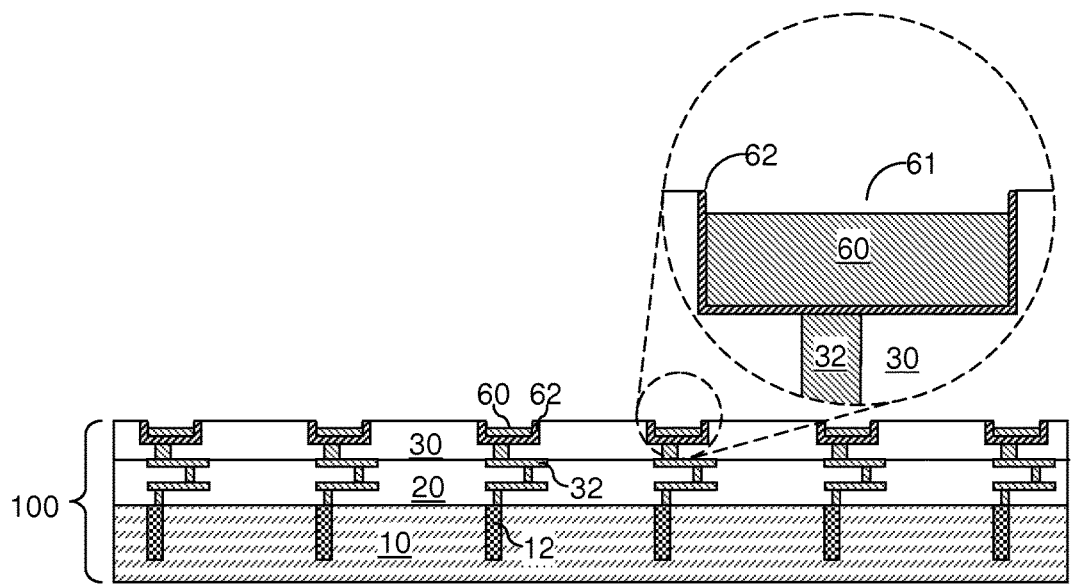
FIG. 3A is a vertical cross-sectional view of a first substrate after recessing first metal pads according to a third embodiment of the present disclosure.

Referring to FIG. 3A, a first substrate 100 according to a third embodiment of the present disclosure can be derived from the first substrate 100 in FIG. 1A of the first embodiment by recessing the first copper-containing pad portions 60 relative to the top surface of the first silicon oxide layer 30. The recessing the first copper-containing pad portions 60 can be performed, for example, by a wet etch, a dry etch, CMP dishing, or their combinations. A recessed region 61 is formed above each first copper-containing pad portion 60.

The vertical distance between the recessed surfaces of the first copper-containing pad portions 60 and the top surface of the first silicon oxide layer 30 can be in a range from 5 nm to 50 nm, although lesser and greater vertical distances can also be employed.

Figure 3B:
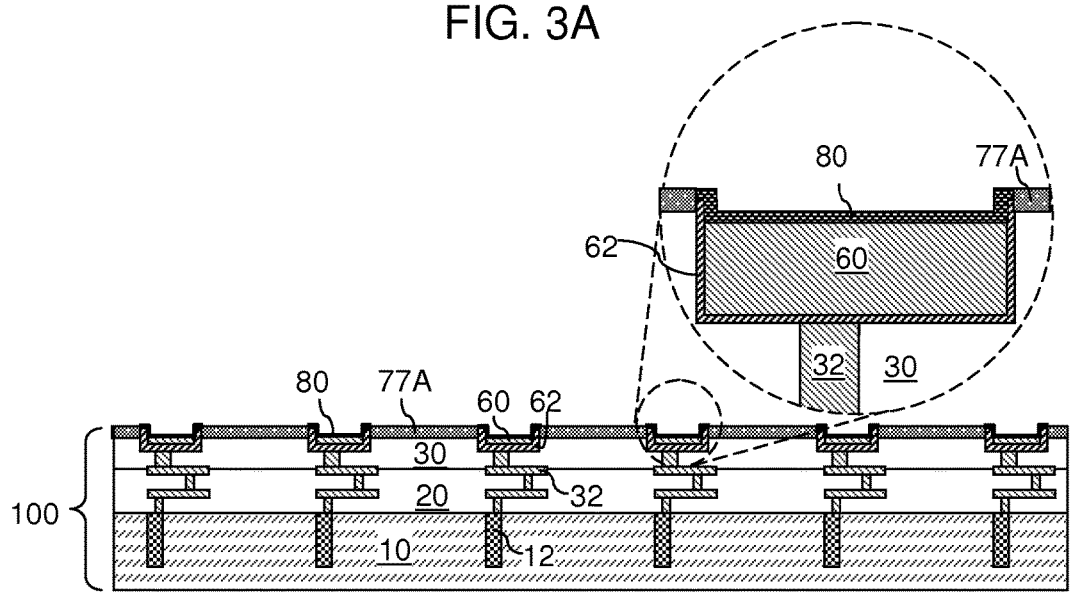
FIG. 3B is a vertical cross-sectional view of the first substrate after introduction of a dopant metal at an elevated temperature and in an oxygen-free environment according to the third embodiment of the present disclosure.

Referring to FIG. 3B, a dopant metal is introduced to surface portions of the first substrate 100 by deposition of the dopant metal at an elevated temperature and in an oxygen-free environment. The dopant metal can be deposited, for example, by physical vapor deposition (PVD), or by electroless plating. The amount of the deposited dopant metal is selected such that the deposited dopant metal forms a contiguous layer of the deposited dopant metal over the first copper-containing pad portions 60. Each continuous layer of the deposited dopant metal is herein referred to as a first dopant metal layer 80. A first metal silicate layer 77A is formed by an interfacial reaction of silicon oxide and the deposited dopant metal over the remaining portion of the first silicon oxide layer 30.

The dopant metal can be selected elemental metals having a greater oxygen-affinity than copper. In one embodiment, the dopant metal does not form a eutectic compound with copper. In one embodiment, the dopant metal segregates from copper under a controlled temperature and ambient including a non-oxidizing ambient at an elevated temperature in a range from 100° C. to 600° C. In one embodiment, the dopant metal does not form a eutectic compound with copper or segregates from copper under a controlled temperature and ambient including a non-oxidizing ambient at an elevated temperature in a range from 100° C. to 600° C. In one embodiment, the dopant metal does not form a eutectic compound with copper and segregates from copper under a controlled temperature and ambient including a non-oxidizing ambient at an elevated temperature in a range from 100° C. to 600° C. In one embodiment, the dopant metal can be at least one elemental metal that is selected from Ti, V, Cr, Mn, Fe, Co, Ni, Zr, Nb, Mo, Lanthanides, Hf, Ta, W, Actinides, Al, and Sn. In one embodiment, the dopant metal can be selected from Ti, V, Cr, Mn, Fe, Co, Ni, Zr, Nb, Mo, Lanthanides, Hf, Ta, W, and Actinides. In another embodiment, the dopant metal can be selected from Al and Sn. In yet another embodiment, the dopant metal can be selected from Mn and Nb.

The thickness of each first dopant metal layer 80 can be from 3 nm to 10 nm, although lesser and greater thicknesses can also be employed. Formation of the first metal silicate layer 77A is optional. If the first metal silicate layer 77A is formed, the thickness of the first metal silicate layer 77A can be in a range from 3 nm to 60 nm, although lesser and greater thicknesses can also be employed.

Figure 3C:
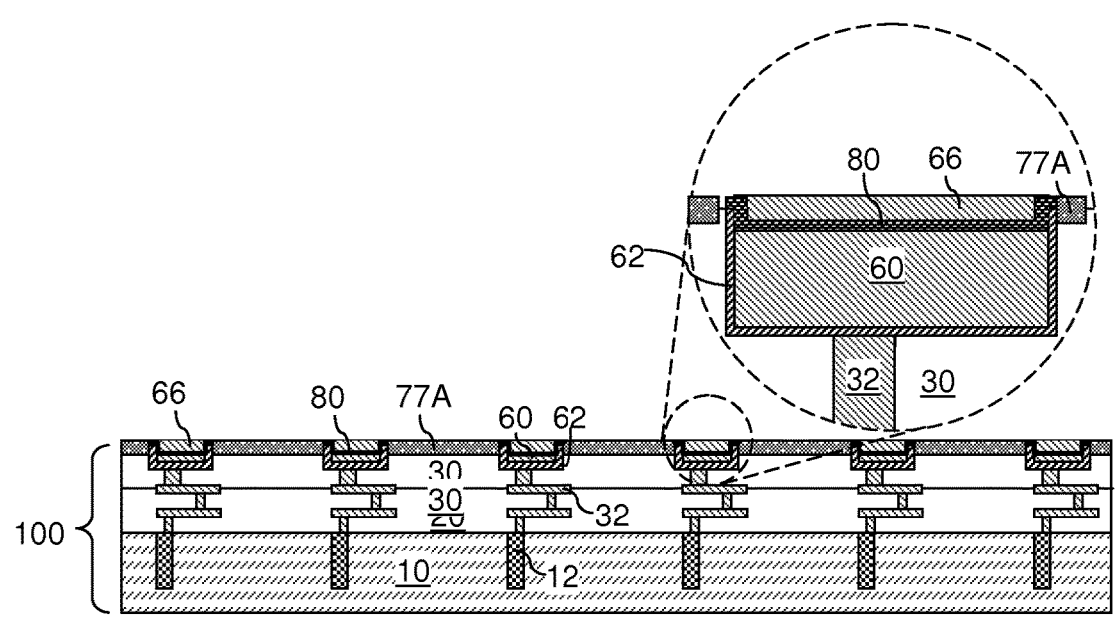
FIG. 3C is a vertical cross-sectional view of the first substrate after deposition and a touch-up planarization of a copper-containing material according to the third embodiment of the present disclosure.

Referring to FIG. 3C, a copper-containing material is deposited into the recessed regions 61. The copper-containing material predominantly includes copper, and can have substantially the same composition as the first copper-containing pad portions 60. A chemical mechanical planarization (CMP) is performed to remove the portions of the deposited copper-containing material. Remaining portions of the deposited copper-containing material have top surfaces that are substantially coplanar with the top surface of the first metal silicate layer 77A, and are herein referred to as first copper-containing caps 66. Each first metal pad (60, 62, 80, 66) includes a first copper-containing pad portion 60, a first metallic nitride liner 62, a first dopant metal layer 80, and a first copper-containing cap 66.

Figure 3D:
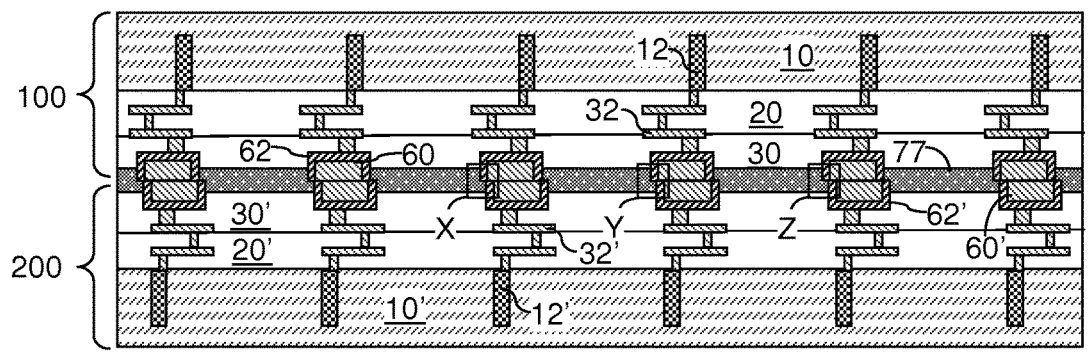
FIG. 3D is a vertical cross-sectional view of a third bonded structure in which the first substrate is bonded with a second substrate according to the third embodiment of the present disclosure.

Referring to FIG. 3D, a second substrate 200 is provided. The second substrate 200 can include all of the elements in the first substrate 100 in FIG. 3C, or can be the same as any of the first substrates 100 immediately before bonding according to the first, second, fourth, or fifth embodiments of the present disclosure.

In one embodiment, processing steps of FIGS. 3A-3C can be formed to introduce the dopant metal into surface regions of the second substrate 200, i.e., by formation of second dopant metal layers including at least another dopant metal on second copper-containing pad portions 60', formation of a second metal silicate layer, and by formation of second copper-containing caps. Alternately, the second substrate 200 can be provided employing any of the processing steps employed to form a first substrate 100 according to first, second, fourth, and fifth embodiments of the present disclosure.

In another embodiment, introduction of a dopant metal into surface regions of the second substrate 200 may be omitted. In this case, the processing steps of FIGS. 3A-3C or equivalent processing steps in the first, second, fourth, and fifth embodiments of the present disclosure can be omitted for the second substrate 200.

The same processing steps are performed as the processing steps of FIG. 1D or as the processing steps of FIG. 2C. The first substrate 100 and the second substrate 200 are brought into contact with each other such that physically exposed horizontal surfaces of the first metal pads (60, 62, 80, 66) contact physically exposed horizontal surfaces of the second metal pads. In one embodiment, each second metal pad can include a second copper-containing pad portion 60', a second metallic nitride liner 62', a second dopant metal layer (not shown), and a second copper-containing cap (not shown).

A bonded structure including the first substrate 100 and the second substrate 200 is formed by annealing the stack of the first substrate 100 and the second substrate 200 while the first metal pads (60, 62, 80, 66) are in contact with the second metal pads, thereby inducing copper-to-copper bonding between the first metal pads (60, 62, 80, 66) and the second metal pads. A third bonded structure illustrated in FIG. 3D can be formed by employing the first substrate 100 illustrated in FIG. 3C and a second substrate 200 formed by methods illustrated in FIGS. 3A-3C. Variations are expressly contemplated herein in which the second substrate 200 is obtained by one of the methods of the first, second, fourth, and fifth embodiments.

The dopant metal in the first dopant metal layers 80 and any additional dopant metal in the optional second dopant metal layers diffuse toward the interface between the metal pads and toward the metallic nitride liners (62, 62'), and form dopant metal rich portions 76. In one embodiment, the separation of the dopant metals from copper can be due to the inability to form eutectics between copper and the dopant metal, and the elevated temperature during the anneal (which is typically in a range from 200° C. to 500° C.) accelerates the separation of the dopant metal from the copper matrix of the first and second copper-containing pad portions (60, 60') and from the first copper-containing caps 66 and from the optional second copper-containing caps. Further, the metallic nitride liners (62, 62') attract the dopant metal, thereby causing a pile-up of the dopant metal near the surfaces of the metallic nitride liners (62, 62'). In one embodiment, the dopant metal rich portions 76 can include a region in which the dopant metal is a predominant element, i.e., more than 50% of all atoms in the region is the dopant metal. Vertically contacting pairs of a first metal pad (60, 62) and a second metal pad (60', 62') is formed within the bonded structure including the first and second substrates (100, 200).

The copper material in the first copper-containing caps 66 is incorporated into the first copper-containing pad portions 60 during the anneal that bonds the first and second substrates (100, 200). Further, the copper material in any second copper-containing caps is incorporated into the second copper-containing pad portions 60 during the anneal that bonds the first and second substrates (100, 200). Due to migration of the dopant metal(s) toward the interface between the first and second substrates (100, 200) and subsequently toward the first and second metallic nitride liners (62, 62'), the first dopant metal layers 80 dissipates and eventually disappears within the first metal pad (60, 62), and any second dopant metal layers in the second substrate 200 dissipates and eventually disappears within the second metal pads (60', 62') during the anneal that bonds the first and second substrates (100, 200).

As the first metal pads (60, 62) are bonded with the second metal pads (60', 62'), a compound including the dopant metal is formed on the first metal pads (60, 62) and/or the second metal pads (60', 62'). The first bonded structure includes a vertical stack of the first substrate 100 and the second substrate 200. The first substrate 100 includes a first silicon oxide layer 30 embedding first metal pads (60, 62) predominantly including copper. The second substrate 200 includes a second silicon oxide layer 30' embedding second metal pads (60', 62') predominantly including copper. Horizontal surfaces of the first metal pads (60, 62) are bonded to surfaces of the second metal pads (60', 62') at a plane of an interface.

The compound including the material(s) the first metal silicate layer 77A and/or a second metal silicate layer provided on the second substrate 200 is formed between the first substrate 100 and the second substrate 200. In one embodiment, the compound is a metal silicate material that is in physical contact with at least one of the first and second silicon oxide layers (30, 30') and with at least one of the first and second metal pads (60, 62, 60', 62'). In one embodiment, the metal silicate material can contact a horizontal surface of one of the first and second metal pads (60, 62, 60', 62') and a sidewall surface of another of the first and second metal pads (60, 62, 60', 62').

In this case, the peripheral portion of the surface at which a metal silicate material layer (77, 77A, 77B) contacts a metal pad (60, 62, 60', 62') can be a surface of a dopant metal rich portion 76 within a metal pad (60, 62, 60', 62').

Figure 3E:
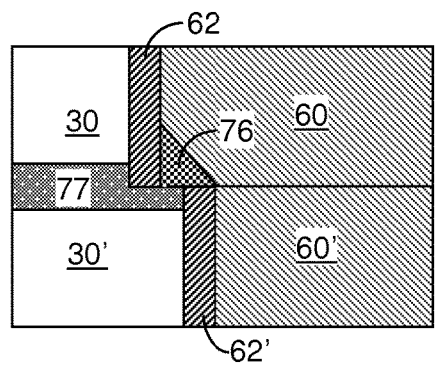
FIG. 3E is a magnified view of the region X in the third bonded structure of FIG. 3D.
Figure 3F:
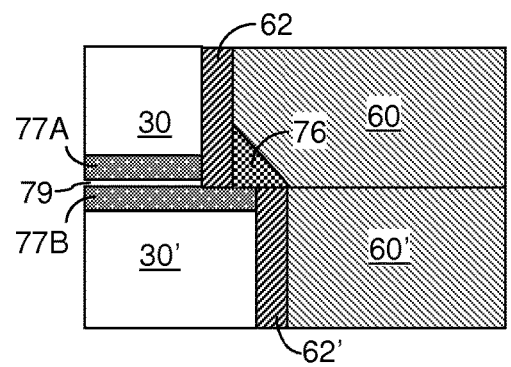
FIG. 3F is a magnified view of the region Y in the third bonded structure of FIG. 3D.
Figure 3G:
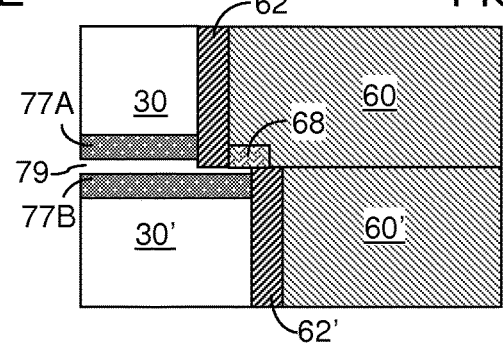
FIG. 3G is a magnified view of the region Z in the third bonded structure of FIG. 3D.

After bonding, the first metal silicate layer 77A and an optional second metal silicate layer (that may be provided on the second substrate 200 prior to bonding) are herein referred to as a metal silicate material layer 77 as illustrated in FIG. 3E, or a pair of metal silicate material layers (77A, 77B) as illustrated in FIGS. 3F and 3G, depending on the microscopic geometry at the interface between the first and second substrates (100, 200). A metal silicate material including the dopant metal and/or a dopant metal provided in the second substrate 200 is formed in the metal silicate material layer(s) (77, 77A, 77B) by reaction of the metal oxide material(s) with the underlying silicon oxide materials in the first and/or second silicon oxide layers (30, 30') during the anneal that bonds the first and second substrates (100, 200). The metal silicate material is a silicate of the dopant metal and/or the dopant metal in the second substrate 200 prior to bonding. Thus, the metal silicate material is a silicate material of at least one elemental metal having a greater oxygen-affinity. In one embodiment, the at least one elemental metal does not form a eutectic compound with copper. In one embodiment, the at least one elemental metal segregates from copper under a controlled temperature and ambient including a non-oxidizing ambient at an elevated temperature in a range from 100° C. to 600° C. In one embodiment, the at least one elemental metal does not form a eutectic compound with copper or segregates from copper under a controlled temperature and ambient including a non-oxidizing ambient at an elevated temperature in a range from 100° C. to 600° C. In one embodiment, the at least one elemental metal does not form a eutectic compound with copper and segregates from copper under a controlled temperature and ambient including a non-oxidizing ambient at an elevated temperature in a range from 100° C. to 600° C.

In each region including a vertically contacting pair of a first metal pad (60, 62) and a second metal pad (60', 62'), the metal silicate material is in physical contact with a peripheral portion of a surface of a first metal pad (60, 62) or a second metal pad (60', 62') at a plane of the interface between the first metal pad (60, 62) and the second metal pad (60', 62'). Further, the metal silicate material is adjoined to at least one of the first and second silicon oxide layers (30, 30'). The metal silicate material is in contact with a surface of a metallic nitride liner (62, 62') laterally surrounding the one of the first and second metal pads (60, 62, 60', 62').

Each dopant metal rich portion 76 includes copper and at least one metallic element that is present within the metal silicate material. Each dopant metal rich portion 76 is formed within the one of the first and second metal pads (60, 62, 60', 62') underneath the horizontal surface by diffusion of the dopant metal into the one of the first and second metal pads (60, 62, 60', 62'). The metallic silicate material can contiguously extend between a pair of metal pads (60, 62, 60', 62') embedded within a same substrate that is selected from the first substrate and the second substrate (100, 200).

Referring to FIG. 3E, a magnified view of the region X in the first bonded structure of FIG. 3D is shown. The combination of the first metal silicate material layer 77A and the second metal silicate material layer 77B can be converted into a metal silicate material layer 77. The metal silicate material layer 77 laterally contact a vertical stack of a first metal pad (60, 62) and a second metal pad (60', 62') without forming any cavity (i.e., a gap) between the first substrate 100 and the second substrate 200. The metal silicate material is in physical contact with a horizontal surface of the first silicon oxide layer 30 and a surface of the second silicon oxide layer 30'.

Referring to FIG. 3F, a magnified view of the region Y in the first bonded structure of FIG. 3D is shown. The first metal silicate material layer 77A and the optional second metal silicate material layer 77B remain as separate layers. The first metal silicate material layer 77A, and the optional second metal silicate material layer 77B, can laterally contact a vertical stack of a first metal pad (60, 62) and a second metal pad (60', 62') with a cavity 79 in contact with the vertical stack of the two metal pads (60, 62, 60', 62') between the first substrate 100 and the second substrate 200. The metal silicate material is in physical contact with a horizontal surface of one of the first and second silicon oxide layers (30, 30'), and does not contact another of the first and second silicon oxide layers (30, 30').

Referring to FIG. 3G, a magnified view of the region Z in the first bonded structure of FIG. 3D is shown. The first metal silicate material layer 77A and the optional second metal silicate material layer 77B remain as separate layers. The first metal silicate material layer 77A and the second metal silicate material layer 77B can laterally contact a vertical stack of a first metal pad (60, 62) and a second metal pad (60', 62') with a cavity 79 therebetween. The metal silicate material is not in physical contact with any horizontal surface of one of the first and second silicon oxide layers (30, 30'). The metal silicate material is present in each of the first metal silicate material layer 77A and the second metal silicate material layer 77B. The metal silicate material of the first metal silicate material layer 77A does not contact the second silicon oxide layer 30', and the metal silicate material of the second metal silicate material layer 77B does not contact the first silicon oxide layer 30.

A metal oxide portion 68 can be formed within a peripheral portion of a metal pad (60, 62, 60', 62') in the vertically contacting pair that is physically exposed to the cavity 79 such that the metal oxide portion 68 includes an oxide of the dopant metal. Specifically, in a vertically contacting pair of metal pads (60, 62, 60', 62'), a first metal pad (60, 62) and a second metal pad (60', 62') can be bonded to each other at an interface such that a horizontal surface of one of the copper-containing pad portions (60, 60') is physically exposed to a cavity 79. The dopant metal can migrate to the physically exposed surface of the copper-containing pad portions (60 or 60') and form an oxide of the dopant metal. Each portion of the metal pad including the oxide of the dopant metal constitutes a metal oxide portion 68. The ambient during the anneal that bonds the first and second substrates (100, 200) is controlled such that the dopant metal is oxidized to form the metal oxide portions 68 while prevention conversion of copper into copper oxide. Each metal oxide portion 68 is embedded within a peripheral portion of a metal pad in the vertically contacting pair. The dopant metal is not present at a center portion of the interface between the copper-containing pad portions (60 or 60') because the dopant metal migrates toward the metallic nitride liners (62, 62'). In this case, the metal oxide portion 68 includes an oxide of a dopant metal that is not present at a portion of the interface at which copper-containing material portions (60, 60') of metal pads are bonded to each other. In one embodiment, a horizontal surface of the metal oxide portion 68 can be coplanar with the interface.

In one embodiment, each metal pad in the vertically contacting pair of metal pads (60, 62, 60', 62') can be physically exposed to a cavity 79 by which a horizontal surface of the first silicon oxide layer 30 is spaced from a horizontal surface of the second silicon oxide layer 30'. In one embodiment, the first metal pad (60, 62) in the vertically contacting pair includes a first metallic nitride liner 62, a second metal pad (60', 62') in the vertically contacting pair includes a second metallic nitride liner 62', and the metal oxide portion 68 can be in contact with the first metallic nitride liner 62 and the second metallic nitride liner 62'.

Figure 4A:
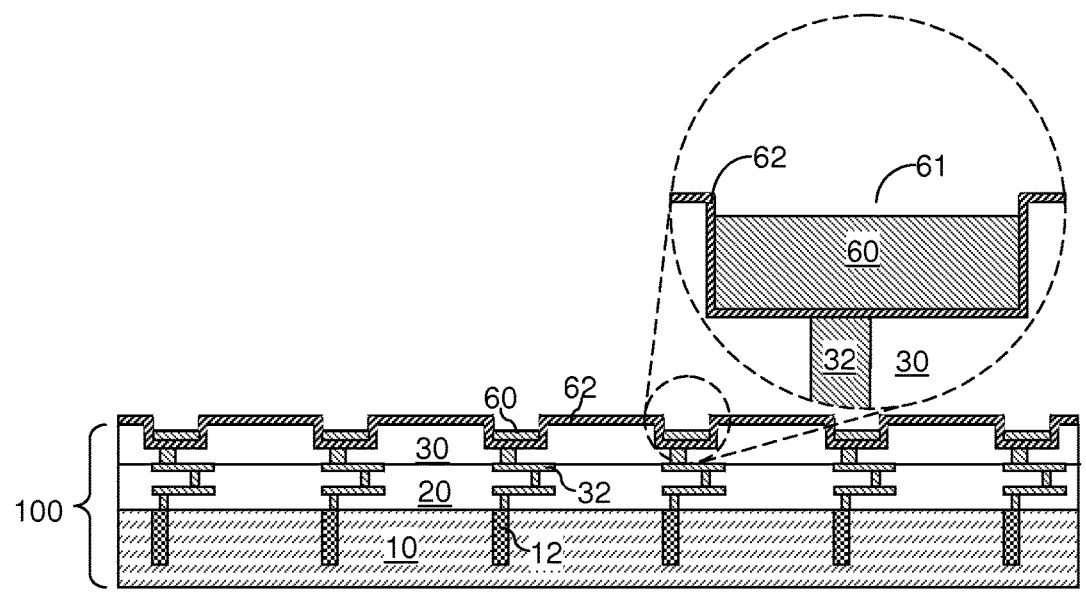
FIG. 4A is a vertical cross-sectional view of a first substrate after recessing first metal pads according to a fourth embodiment of the present disclosure.

Referring to FIG. 4A, a first substrate 100 according to a fourth embodiment of the present disclosure can be derived from the first substrate 100 in FIG. 1A of the first embodiment by retaining the first metallic nitride liner 62 over the top surface of the first silicon oxide layer 30, and recessing the first copper-containing pad portions 60 relative to the top surface of the first metallic nitride liner 62. Thus, the first metallic nitride liner 62 can be present on the entirety of the first substrate 100 without a hole therein. The recessing the first copper-containing pad portions 60 relative to the first metallic nitride liner 62 can be performed, for example, by a wet etch or a dry etch. A recessed region 61 is formed above each first copper-containing pad portion 60. The vertical distance between the recessed surfaces of the first copper-containing pad portions 60 and the top surface of the first metallic nitride liner 62 can be in a range from 5 nm to 50 nm, although lesser and greater vertical distances can also be employed.

Figure 4B:
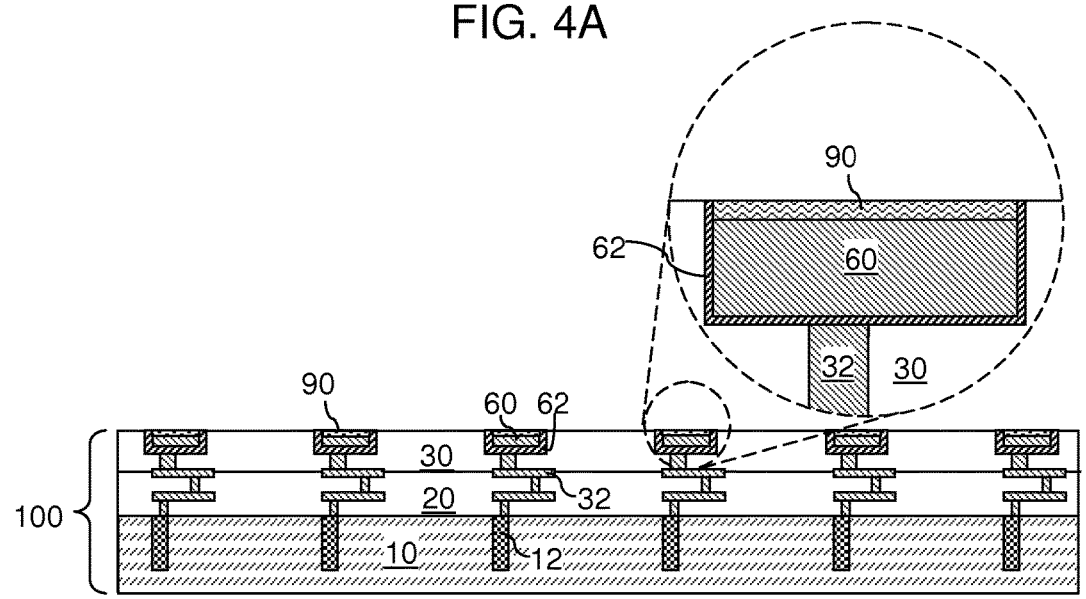
FIG. 4B is a vertical cross-sectional view of the first substrate after introduction of a dopant metal by deposition of an alloy including copper and the dopant metal and a subsequent touch-up planarization according to the fourth embodiment of the present disclosure.

Referring to FIG. 4B, a dopant metal is introduced to surface portions of the first substrate 100 by deposition of an alloy of copper and the dopant metal and in an oxygen-free environment. The alloy of copper and the dopant metal can be deposited, for example, by physical vapor deposition (PVD). In one embodiment, the atomic percentage of the dopant metal in the alloy can be in a range from 0.1% to 10% of the deposited material, and the balance can be copper. In one embodiment, the temperature of the deposition process can be less than 100° C. to avoid segregation of the dopant metal from copper.

The dopant metal can be selected elemental metals having a greater oxygen-affinity than copper. In one embodiment, the dopant metal does not form a eutectic compound with copper. In one embodiment, the dopant metal segregates from copper under a controlled temperature and ambient including a non-oxidizing ambient at an elevated temperature in a range from 100° C. to 600° C. In one embodiment, the dopant metal does not form a eutectic compound with copper or segregates from copper under a controlled temperature and ambient including a non-oxidizing ambient at an elevated temperature in a range from 100° C. to 600° C. In one embodiment, the dopant metal does not form a eutectic compound with copper and segregates from copper under a controlled temperature and ambient including a non-oxidizing ambient at an elevated temperature in a range from 100° C. to 600° C. In one embodiment, the dopant metal can be at least one elemental metal that is selected from Ti, V, Cr, Mn, Fe, Co, Ni, Zr, Nb, Mo, Lanthanides, Hf, Ta, W, Actinides, Al, and Sn. In one embodiment, the dopant metal can be selected from Ti, V, Cr, Mn, Fe, Co, Ni, Zr, Nb, Mo, Lanthanides, Hf, Ta, W, and Actinides. In another embodiment, the dopant metal can be selected from Al and Sn. In yet another embodiment, the dopant metal can be selected from Mn and Nb.

A touch-up chemical mechanical planarization (CMP) is performed to remove the portions of the deposited alloy of copper and the dopant metal. Further, the horizontal portions of the first metallic nitride liner 62 above the top surface of the first silicon oxide layer 30 are also removed during the touch-up CMP. A top surface of the first silicon oxide layer 30 is physically exposed after the touch-up CMP. Remaining portions of the deposited alloy have top surfaces that are substantially coplanar with the physically exposed horizontal top surfaces of the first silicon oxide layer 30. The remaining portions of the deposited alloy are herein referred to as first dopant metal-copper alloy portions 90. Each first metal pad (60, 62, 90) includes a first copper-containing pad portion 60, a first metallic nitride liner 62, and a first dopant metal-copper alloy portion 90. The thickness of the first dopant metal-copper alloy portions 90 can be in a range from 3 nm to 30 nm, although lesser and greater thicknesses can also be employed.

Figure 4C:
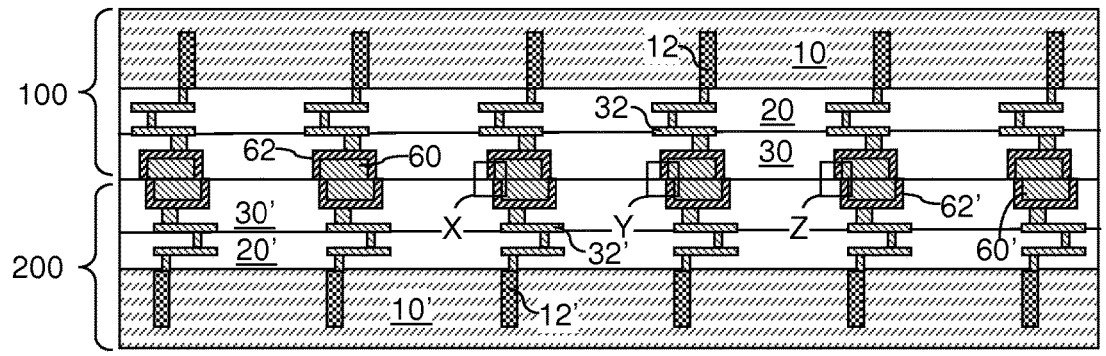
FIG. 4C is a vertical cross-sectional view of a fourth bonded structure in which the first substrate is bonded with a second substrate according to the fourth embodiment of the present disclosure.

Referring to FIG. 4C, a second substrate 200 is provided. The second substrate 200 can include all of the elements in the first substrate 100 in FIG. 4B, or can be the same as any of the first substrates 100 immediately before bonding according to the first, second, third, or fifth embodiments of the present disclosure.

In one embodiment, processing steps of FIGS. 4A and 4B can be formed to introduce the dopant metal into surface regions of the second substrate 200, i.e., by formation of a continuous first metallic nitride liner 62, recessing of the first copper-containing pad portions 60, deposition of an alloy including copper and a dopant metal, and a touch-up CMP that physically exposes a top surface of the first silicon oxide layer 30. Alternately, the second substrate 200 can be provided employing any of the processing steps employed to form a first substrate 100 according to first, second, third, and fifth embodiments of the present disclosure.

In another embodiment, introduction of a dopant metal into surface regions of the second substrate 200 may be omitted. In this case, the processing steps of FIGS. 4A and 4B, or equivalent processing steps in the first, second, third, and fifth embodiments of the present disclosure can be omitted for the second substrate 200.

The same processing steps are performed as the processing steps of FIG. 1D, or as the processing steps of FIG. 2C, or as in the processing steps of FIG. 3D. The first substrate 100 and the second substrate 200 are brought into contact with each other such that physically exposed horizontal surfaces of the first metal pads (60, 62, 90) contact physically exposed horizontal surfaces of the second metal pads. In one embodiment, each second metal pad can include a second copper-containing pad portion 60', a second metallic nitride liner 62', and a second dopant metal-copper alloy portion (not shown).

A bonded structure including the first substrate 100 and the second substrate 200 is formed by annealing the stack of the first substrate 100 and the second substrate 200 while the first metal pads (60, 62, 90) are in contact with the second metal pads, thereby inducing copper-to-copper bonding between the first metal pads (60, 62, 90) and the second metal pads. A fourth bonded structure illustrated in FIG. 4C can be formed by employing the first substrate 100 illustrated in FIG. 4B and a second substrate 200 formed by methods illustrated in FIGS. 4A and 4B. Variations are expressly contemplated herein in which the second substrate 200 is obtained by one of the methods of the first, second, third, and fifth embodiments.

The dopant metal in the first dopant metal-copper alloy portions 90 and any additional dopant metal in the optional second dopant metal-copper alloy portions diffuse toward the interface between the two substrates (100, 200) and toward the metallic nitride liners (62, 62') by surface diffusion, and form dopant metal rich portions 76. In one embodiment, the separation of the dopant metals from copper is due to the inability to form eutectics between copper and the dopant metal, and the elevated temperature during the anneal (which is typically in a range from 200° C. to 500° C.) accelerates the separation of the dopant metal from first dopant metal-copper alloy portions 90 and from the optional second dopant metal-copper alloy portions. Further, the metallic nitride liners (62, 62') attract the dopant metal, thereby causing a pile-up of the dopant metal near the surfaces of the metallic nitride liners (62, 62'). In one embodiment, the dopant metal rich portions 76 can include a region in which the dopant metal is a predominant element, i.e., more than 50% of all atoms in the region is the dopant metal. Vertically contacting pairs of a first metal pad (60, 62) and a second metal pad (60', 62') is formed within the bonded structure including the first and second substrates (100, 200).

The copper material in each first dopant metal-copper alloy portion 90 is incorporated into the underlying first copper-containing pad portions 60 during the anneal that bonds the first and second substrates (100, 200). Further, the copper material in any second dopant metal-copper alloy portion is incorporated into the underlying second copper-containing pad portions 60 during the anneal that bonds the first and second substrates (100, 200). Due to migration of the dopant metal(s) toward the interface between the first and second substrates (100, 200) and subsequently toward the first and second metallic nitride liners (62, 62'), the first dopant metal-copper alloy portions 90 dissipate and eventually disappear within the first metal pads (60, 62), and any second dopant metal-copper alloy portions in the second substrate 200 dissipate and eventually disappear within the second metal pads (60', 62') during the anneal that bonds the first and second substrates (100, 200).

The first bonded structure includes a vertical stack of the first substrate 100 and the second substrate 200. The first substrate 100 includes a first silicon oxide layer 30 embedding first metal pads (60, 62) predominantly including copper. The second substrate 200 includes a second silicon oxide layer 30' embedding second metal pads (60', 62') predominantly including copper. Horizontal surfaces of the first metal pads (60, 62) are bonded to surfaces of the second metal pads (60', 62') at a plane of an interface. As the first metal pads (60, 62) are bonded with the second metal pads (60', 62'), a first compound including the dopant metal may be formed in the first metal pads (60, 62) and/or the second metal pads (60', 62'). The first compound is the alloy of the dopant metal and copper that is formed in the dopant metal rich portions 76.

The dopant metal in the dopant metal rich portions 76 can diffuse out into portions of the first and second silicon oxide layers (30, 30') that are proximal to the vertical stacks of the first and second metal pads (60, 62, 60', 62'), and react with the silicon oxide material in the first and/or second silicon oxide layers (30, 30'). The reaction of the diffused dopant metal and the silicon oxide material forms metal silicate portions 77P. Thus, as the first metal pads (60, 62) are bonded with the second metal pads (60', 62'), a second compound including a silicate of the dopant metal may be formed on the first metal pads (60, 62) and/or the second metal pads (60', 62').

The second compound can be formed at the interface between the first substrate 100 and the second substrate 200. The second compound is a metal silicate material that is in physical contact with at least one of the first and second silicon oxide layers (30, 30') and with at least one of the first and second metal pads (60, 62, 60', 62'). In one embodiment, the metal silicate material can contact a horizontal surface of one of the first and second metal pads (60, 62, 60', 62') and a sidewall surface of another of the first and second metal pads (60, 62, 60', 62'). In this case, the peripheral portion of the surface at which a metal silicate material portion 77P contacts a metal pad (60, 62, 60', 62') can be a surface of a dopant metal rich portion 76 within a metal pad (60, 62, 60', 62'). Thus, the metal silicate material is a silicate material of at least one elemental metal having a greater oxygen-affinity than copper. In one embodiment, the at least one elemental metal does not form a eutectic compound with copper. In one embodiment, the at least one elemental metal segregates from copper under a controlled temperature and ambient including a non-oxidizing ambient at an elevated temperature in a range from 100° C. to 600° C. In one embodiment, the at least one elemental metal does not form a eutectic compound with copper or segregates from copper under a controlled temperature and ambient including a non-oxidizing ambient at an elevated temperature in a range from 100° C. to 600° C. In one embodiment, the at least one elemental metal does not form a eutectic compound with copper and segregates from copper under a controlled temperature and ambient including a non-oxidizing ambient at an elevated temperature in a range from 100° C. to 600° C.

In each region including a vertically contacting pair of a first metal pad (60, 62) and a second metal pad (60', 62'), the metal silicate material is in physical contact with a peripheral portion of a surface of a first metal pad (60, 62) or a second metal pad (60', 62') at a plane of the interface between the first metal pad (60, 62) and the second metal pad (60', 62'). Further, the metal silicate material is adjoined to at least one of the first and second silicon oxide layers (30, 30'). The metal silicate material is in contact with a surface of a metallic nitride liner (62, 62') laterally surrounding the one of the first and second metal pads (60, 62, 60', 62').

Each dopant metal rich portion 76 includes copper and at least one metallic element that is present within the metal silicate material. Each metal silicate portion 77P can physically contact a single first metal pad (60, 62) and a single second metal pad (60', 62'). Each metal silicate portion 77P physically contacts a dopant metal rich portion 76.

Figure 4D:
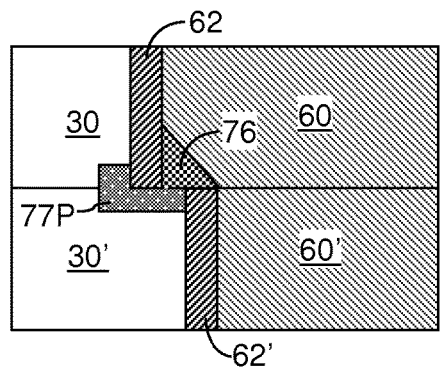
FIG. 4D is a magnified view of the region X in the fourth bonded structure of FIG. 4D.

Referring to FIG. 4D, a magnified view of the region X in the first bonded structure of FIG. 4C is shown. The metal silicate portion 77P can laterally contact a vertical stack of a first metal pad (60, 62) and a second metal pad (60', 62') without forming any cavity (i.e., a gap) between the first substrate 100 and the second substrate 200. The metal silicate portion 77P can be in physical contact with the first silicon oxide layer 30 and the second silicon oxide layer 30'.

Figure 4E:
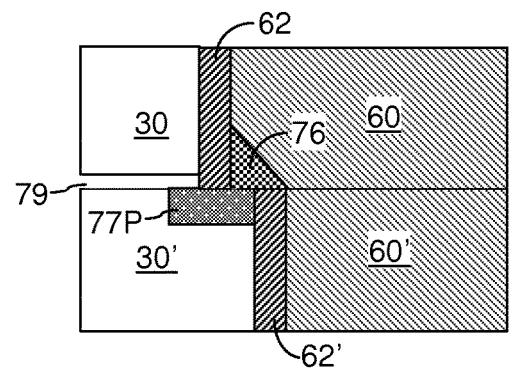
FIG. 4E is a magnified view of the region Y in the fourth bonded structure of FIG. 4D.

Referring to FIG. 4E, a magnified view of the region Y in the first bonded structure of FIG. 4C is shown. The metal silicate portion 77P can physically contact a horizontal surface of one of the metal pads a vertical stack of a first metal pad (60, 62) and a second metal pad (60', 62'), and a vertical surface of the other of the metal pads in the vertical stack. The metal pad 77P can contact a silicon oxide layer that is in physical contact with the other of the metal pads. A cavity 79 in contact with the vertical stack of the two metal pads (60, 62, 60', 62') is present between the first substrate 100 and the second substrate 200. The metal silicate material is in physical contact with a horizontal surface of one of the first and second silicon oxide layers (30, 30'), and does not contact another of the first and second silicon oxide layers (30, 30').

Figure 4F:
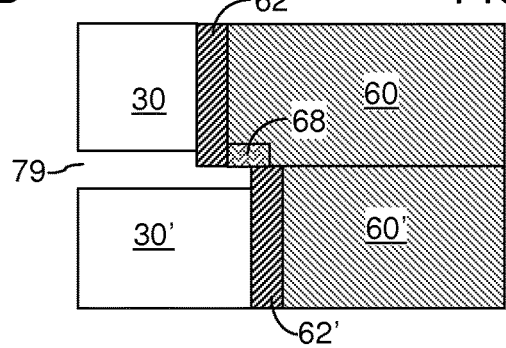
FIG. 4F is a magnified view of the region Z in the fourth bonded structure of FIG. 4D.

Referring to FIG. 4F, a magnified view of the region Z in the first bonded structure of FIG. 3D is shown. A cavity 79 is in contact with a horizontal surface of one of the metal pads in the vertical stack of a first metal pad (60, 62) and a second metal pad (60', 62'). In this case, a metal silicate portion is not formed.

Physical exposure of a horizontal surface of a first dopant metal-copper alloy portion 90 or a second dopant metal-copper alloy portion causes formation of a metal oxide portion 68 within one of the first and second metal pads (60, 62, 60', 62'). The metal oxide portion 68 can be formed within a peripheral portion of a metal pad (60, 62, 60', 62') in the vertically contacting pair that is physically exposed to the cavity 79 such that the metal oxide portion 68 includes an oxide of the dopant metal, which is a third compound including the dopant metal. Specifically, in a vertically contacting pair of metal pads (60, 62, 60', 62'), a first metal pad (60, 62) and a second metal pad (60', 62') can be bonded to each other at an interface such that a horizontal surface of one of the copper-containing pad portions (60, 60') is physically exposed to a cavity 79. The dopant metal can migrate to the physically exposed surface of the copper-containing pad portions (60 or 60') and form an oxide of the dopant metal. Each portion of the metal pad including the oxide of the dopant metal constitutes a metal oxide portion 68. The ambient during the anneal that bonds the first and second substrates (100, 200) is controlled such that the dopant metal is oxidized to form the metal oxide portions 68 while prevention conversion of copper into copper oxide. Each metal oxide portion 68 is embedded within a peripheral portion of a metal pad in the vertically contacting pair. The dopant metal is not present at a center portion of the interface between the copper-containing pad portions (60 or 60') because the dopant metal migrates toward the metallic nitride liners (62, 62'). In this case, the metal oxide portion 68 includes an oxide of a dopant metal that is not present at a portion of the interface at which copper-containing material portions (60, 60') of metal pads are bonded to each other. In one embodiment, a horizontal surface of the metal oxide portion 68 can be coplanar with the interface.

In one embodiment, each metal pad in the vertically contacting pair of metal pads (60, 62, 60', 62') can be physically exposed to a cavity 79 by which a horizontal surface of the first silicon oxide layer 30 is spaced from a horizontal surface of the second silicon oxide layer 30'. In one embodiment, the first metal pad (60, 62) in the vertically contacting pair includes a first metallic nitride liner 62, a second metal pad (60', 62') in the vertically contacting pair includes a second metallic nitride liner 62', and the metal oxide portion 68 can be in contact with the first metallic nitride liner 62 and the second metallic nitride liner 62'.

Figure 5A:
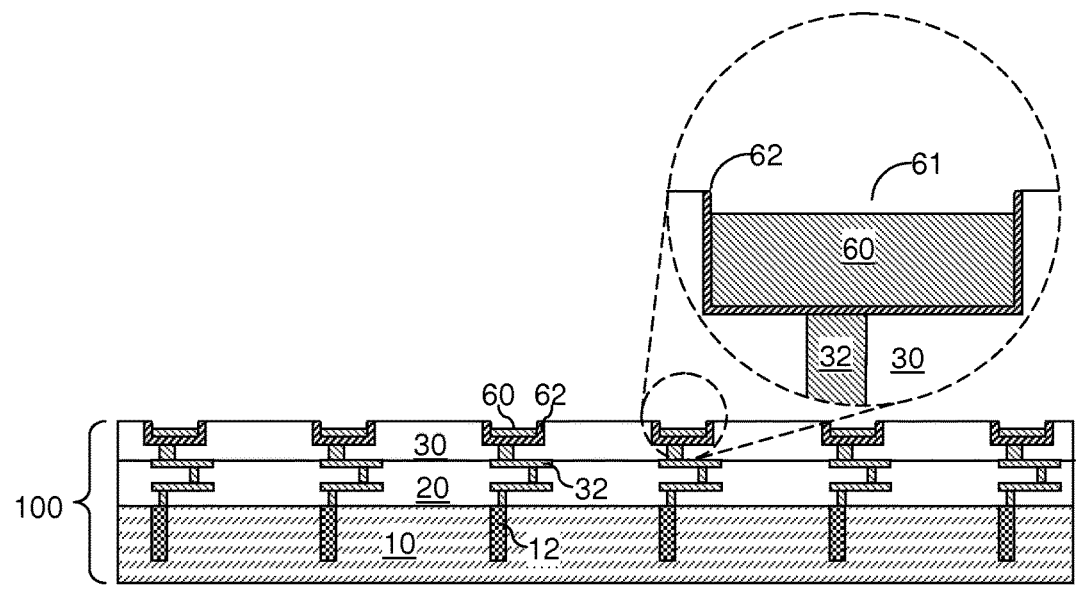
FIG. 5A is a vertical cross-sectional view of a first substrate after recessing first metal pads according to a fifth embodiment of the present disclosure.

Referring to FIG. 5A, a first substrate 100 according to a fifth embodiment of the present disclosure can be the same as the first substrate 100 in FIG. 3A of the third embodiment.

Figure 5B:
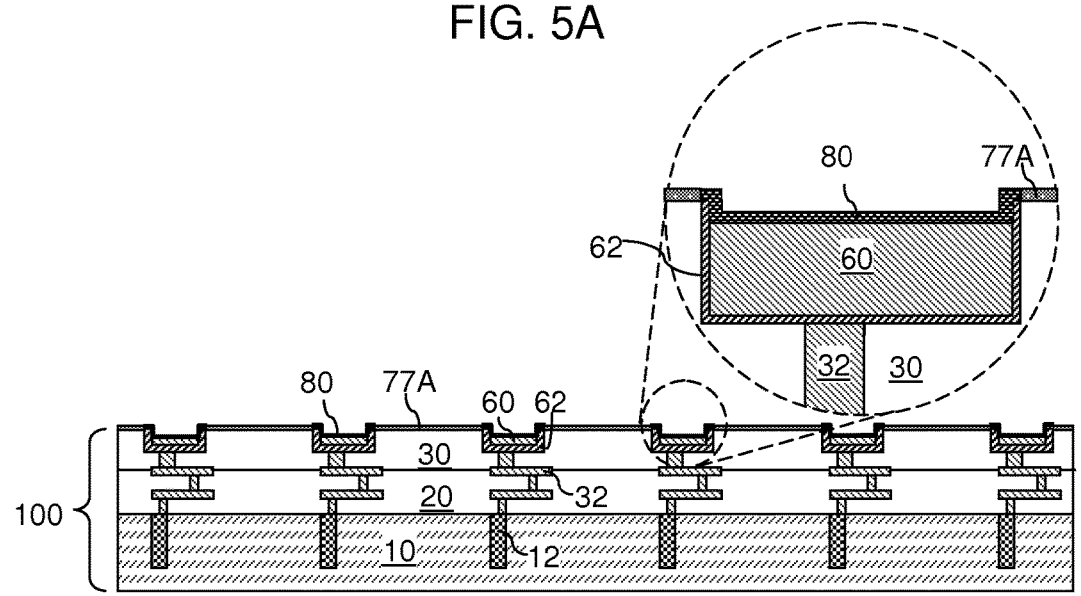
FIG. 5B is a vertical cross-sectional view of the first substrate after deposition of a dopant metal in an oxygen-free environment according to the fifth embodiment of the present disclosure.

Referring to FIG. 5B, a dopant metal is introduced to surface portions of the first substrate 100 by deposition of the dopant metal in an oxygen-free environment. The temperature of deposition can be elevated (e.g., in a range from 300° C. to 500° C.), or can be room temperature (e.g., 300K). The dopant metal can be deposited, for example, by physical vapor deposition (PVD). The amount of the deposited dopant metal is selected such that the deposited dopant metal forms a contiguous layer of the deposited dopant metal over the first copper-containing pad portions 60 as in the third embodiment. Each continuous layer of the deposited dopant metal is herein referred to as a first dopant metal layer 80. A first metal silicate layer 77A may be formed by an interfacial reaction of silicon oxide and the deposited dopant metal over the remaining portion of the first silicon oxide layer 30.

The dopant metal can be selected elemental metals having a greater oxygen-affinity than copper. In one embodiment, the dopant metal does not form a eutectic compound with copper. In one embodiment, the dopant metal segregates from copper under a controlled temperature and ambient including a non-oxidizing ambient at an elevated temperature in a range from 100° C. to 600° C. In one embodiment, the dopant metal does not form a eutectic compound with copper or segregates from copper under a controlled temperature and ambient including a non-oxidizing ambient at an elevated temperature in a range from 100° C. to 600° C. In one embodiment, the dopant metal does not form a eutectic compound with copper and segregates from copper under a controlled temperature and ambient including a non-oxidizing ambient at an elevated temperature in a range from 100° C. to 600° C. In one embodiment, the dopant metal can be at least one elemental metal that is selected from Ti, V, Cr, Mn, Fe, Co, Ni, Zr, Nb, Mo, Lanthanides, Hf, Ta, W, Actinides, Al, and Sn. In one embodiment, the dopant metal can be selected from Ti, V, Cr, Mn, Fe, Co, Ni, Zr, Nb, Mo, Lanthanides, Hf, Ta, W, and Actinides. In another embodiment, the dopant metal can be selected from Al and Sn. In yet another embodiment, the dopant metal can be selected from Mn and Nb.

The thickness of each first dopant metal layer 80 can be from 3 nm to 10 nm, although lesser and greater thicknesses can also be employed. The thickness of the first metal silicate layer 77A can be in a range from 1 nm to 20 nm, although lesser and greater thicknesses can also be employed. The thickness of the first metal silicate layer 77A can be controlled such that the bottommost surface of the first metal silicate layer 77A is located above the top surface of the horizontal portion of the first dopant metal layer by a vertical distance in a range from 5 nm to 30 nm.

Figure 5C:
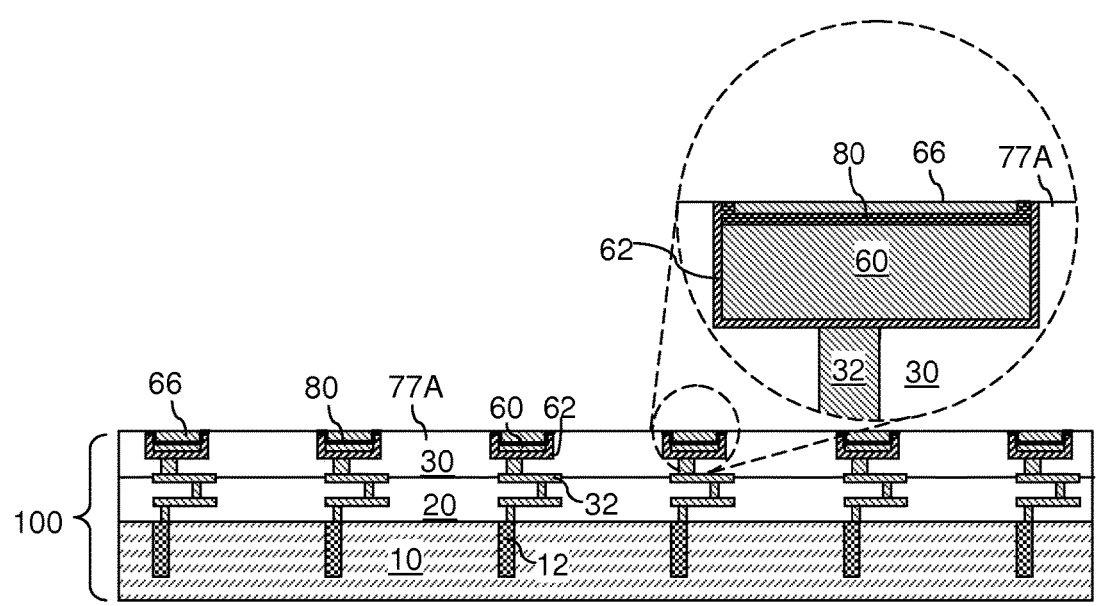
FIG. 5C is a vertical cross-sectional view of the first substrate after deposition and a touch-up planarization of a copper-containing material according to the fifth embodiment of the present disclosure.

Referring to FIG. 5C, a copper-containing material is deposited into the recessed regions 61. The copper-containing material predominantly includes copper, and can have substantially the same composition as the first copper-containing pad portions 60. A touch-up chemical mechanical planarization (CMP) is performed to remove the first metal silicate layer 77A and portions of the deposited copper-containing material from above the bottom surface of the first metal silicate layer 77A. A top surface of the first silicon oxide layer 30 is physically exposed after the touch-up CMP. Remaining portions of the deposited copper-containing material have top surfaces that are substantially coplanar with the top surface of the first silicon oxide layer 30, and are herein referred to as first copper-containing caps 66. Each first metal pad (60, 62, 80, 66) includes a first copper-containing pad portion 60, a first metallic nitride liner 62, a first dopant metal layer 80, and a first copper-containing cap 66.

Figure 5D:
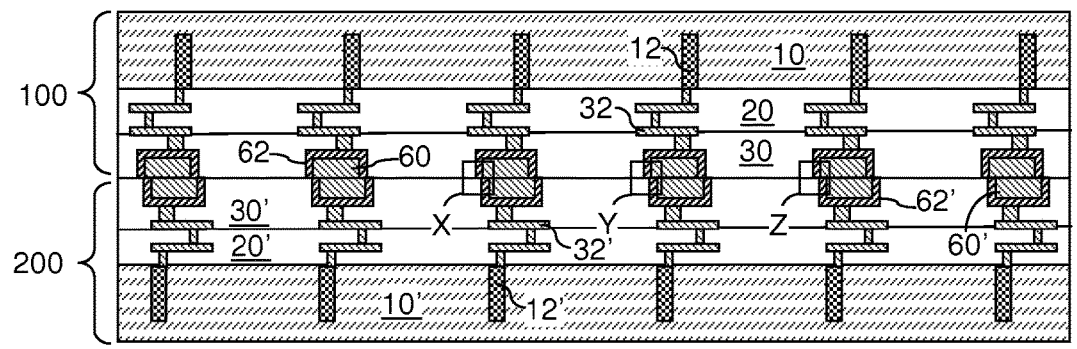
FIG. 5D is a vertical cross-sectional view of a fifth bonded structure in which the first substrate is bonded with a second substrate according to the fifth embodiment of the present disclosure.

Referring to FIG. 5D, a second substrate 200 is provided. The second substrate 200 can include all of the elements in the first substrate 100 in FIG. 3C, or can be the same as any of the first substrates 100 immediately before bonding according to the first, second, third, or fourth embodiments of the present disclosure.

In one embodiment, processing steps of FIGS. 5A-5C can be formed to introduce the dopant metal into surface regions of the second substrate 200, i.e., by formation of second dopant metal layers including at least another dopant metal on second copper-containing pad portions 60', by formation of second copper-containing caps, and by physically exposing the top surface of the second silicon oxide layer 30'. Alternately, the second substrate 200 can be provided employing any of the processing steps employed to form a first substrate 100 according to first, second, third, and fourth embodiments of the present disclosure.

In another embodiment, introduction of a dopant metal into surface regions of the second substrate 200 may be omitted. In this case, the processing steps of FIGS. 5A-5C or equivalent processing steps in the first, second, third, and fourth embodiments of the present disclosure can be omitted for the second substrate 200.

The same processing steps are performed as the processing steps of FIG. 1D, the processing steps of FIG. 2C, the processing steps of FIG. 3D, or the processing steps of FIG. 4C. The first substrate 100 and the second substrate 200 are brought into contact with each other such that physically exposed horizontal surfaces of the first metal pads (60, 62, 80, 66) contact physically exposed horizontal surfaces of the second metal pads. In one embodiment, each second metal pad can include a second copper-containing pad portion 60', a second metallic nitride liner 62', a second dopant metal layer (not shown), and a second copper-containing cap (not shown).

A bonded structure including the first substrate 100 and the second substrate 200 is formed by annealing the stack of the first substrate 100 and the second substrate 200 while the first metal pads (60, 62, 80, 66) are in contact with the second metal pads, thereby inducing copper-to-copper bonding between the first metal pads (60, 62, 80, 66) and the second metal pads. A fifth bonded structure illustrated in FIG. 5D can be formed by employing the first substrate 100 illustrated in FIG. 5C and a second substrate 200 formed by methods illustrated in FIGS. 5A-5C. Variations are expressly contemplated herein in which the second substrate 200 is obtained by one of the methods of the first, second, third, and fourth embodiments.

The dopant metal in the first dopant metal layers 80 and any additional dopant metal in the optional second dopant metal layers diffuse toward the interface between the metal pads and toward the metallic nitride liners (62, 62') by surface diffusion, and form dopant metal rich portions 76. In one embodiment, the separation of the dopant metals from copper is due to the inability to form eutectics between copper and the dopant metal, and the elevated temperature during the anneal (which is typically in a range from 200° C. to 500° C.) accelerates the separation of the dopant metal from the copper matrix of the first and second copper-containing pad portions (60, 60') and from the first copper-containing caps 66 and from the optional second copper-containing caps. Further, the metallic nitride liners (62, 62') attract the dopant metal, thereby causing a pile-up of the dopant metal near the surfaces of the metallic nitride liners (62, 62'). In one embodiment, the dopant metal rich portions 76 can include a region in which the dopant metal is a predominant element, i.e., more than 50% of all atoms in the region is the dopant metal. Vertically contacting pairs of a first metal pad (60, 62) and a second metal pad (60', 62') is formed within the bonded structure including the first and second substrates (100, 200).

The copper material in the first copper-containing caps 66 is incorporated into the first copper-containing pad portions 60 during the anneal that bonds the first and second substrates (100, 200). Further, the copper material in any second copper-containing caps is incorporated into the second copper-containing pad portions 60 during the anneal that bonds the first and second substrates (100, 200). Due to migration of the dopant metal(s) toward the interface between the first and second substrates (100, 200) and subsequently toward the first and second metallic nitride liners (62, 62'), the first dopant metal layers 80 dissipates and eventually disappears within the first metal pad (60, 62), and any second dopant metal layers in the second substrate 200 dissipates and eventually disappears within the second metal pads (60', 62') during the anneal that bonds the first and second substrates (100, 200).

The first bonded structure includes a vertical stack of the first substrate 100 and the second substrate 200. The first substrate 100 includes a first silicon oxide layer 30 embedding first metal pads (60, 62) predominantly including copper. The second substrate 200 includes a second silicon oxide layer 30' embedding second metal pads (60', 62') predominantly including copper. Horizontal surfaces of the first metal pads (60, 62) are bonded to surfaces of the second metal pads (60', 62') at a plane of an interface. As the first metal pads (60, 62) are bonded with the second metal pads (60', 62'), a first compound including the dopant metal may be formed in the first metal pads (60, 62) and/or the second metal pads (60', 62'). The first compound is the alloy of the dopant metal and copper that is formed in the dopant metal rich portions 76.

The dopant metal in the dopant metal rich portions 76 can diffuse out into portions of the first and second silicon oxide layers (30, 30') that are proximal to the vertical stacks of the first and second metal pads (60, 62, 60', 62'), and react with the silicon oxide material in the first and/or second silicon oxide layers (30, 30'). The reaction of the diffused dopant metal and the silicon oxide material forms metal silicate portions 77P. Thus, as the first metal pads (60, 62) are bonded with the second metal pads (60', 62'), a second compound including a silicate of the dopant metal may be formed on the first metal pads (60, 62) and/or the second metal pads (60', 62').

The second compound can be formed at the interface between the first substrate 100 and the second substrate 200. The second compound is a metal silicate material that is in physical contact with at least one of the first and second silicon oxide layers (30, 30') and with at least one of the first and second metal pads (60, 62, 60', 62'). In one embodiment, the metal silicate material can contact a horizontal surface of one of the first and second metal pads (60, 62, 60', 62') and a sidewall surface of another of the first and second metal pads (60, 62, 60', 62'). In this case, the peripheral portion of the surface at which a metal silicate material portion 77P contacts a metal pad (60, 62, 60', 62') can be a surface of a dopant metal rich portion 76 within a metal pad (60, 62, 60', 62'). Thus, the metal silicate material is a silicate material of at least one elemental metal having a greater oxygen-affinity than copper. In one embodiment, the at least one elemental metal does not form a eutectic compound with copper. In one embodiment, the at least one elemental metal segregates from copper under a controlled temperature and ambient including a non-oxidizing ambient at an elevated temperature in a range from 100° C. to 600° C. In one embodiment, the at least one elemental metal does not form a eutectic compound with copper or segregates from copper under a controlled temperature and ambient including a non-oxidizing ambient at an elevated temperature in a range from 100° C. to 600° C. In one embodiment, the at least one elemental metal does not form a eutectic compound with copper and segregates from copper under a controlled temperature and ambient including a non-oxidizing ambient at an elevated temperature in a range from 100° C. to 600° C.

In each region including a vertically contacting pair of a first metal pad (60, 62) and a second metal pad (60', 62'), the metal silicate material is in physical contact with a peripheral portion of a surface of a first metal pad (60, 62) or a second metal pad (60', 62') at a plane of the interface between the first metal pad (60, 62) and the second metal pad (60', 62'). Further, the metal silicate material is adjoined to at least one of the first and second silicon oxide layers (30, 30'). The metal silicate material is in contact with a surface of a metallic nitride liner (62, 62') laterally surrounding the one of the first and second metal pads (60, 62, 60', 62').

Each dopant metal rich portion 76 includes copper and at least one metallic element that is present within the metal silicate material. Each metal silicate portion 77P can physically contact a single first metal pad (60, 62) and a single second metal pad (60', 62'). Each metal silicate portion 77P physically contacts a dopant metal rich portion 76.

Figure 5E:
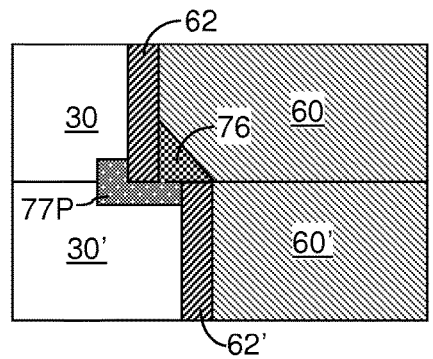
FIG. 5E is a magnified view of the region X in the fifth bonded structure of FIG. 5D.

Referring to FIG. 5E, a magnified view of the region X in the first bonded structure of FIG. 5D is shown. The metal silicate portion 77P can laterally contact a vertical stack of a first metal pad (60, 62) and a second metal pad (60', 62') without forming any cavity (i.e., a gap) between the first substrate 100 and the second substrate 200. The metal silicate portion 77P can be in physical contact with the first silicon oxide layer 30 and the second silicon oxide layer 30'.

Figure 5F:
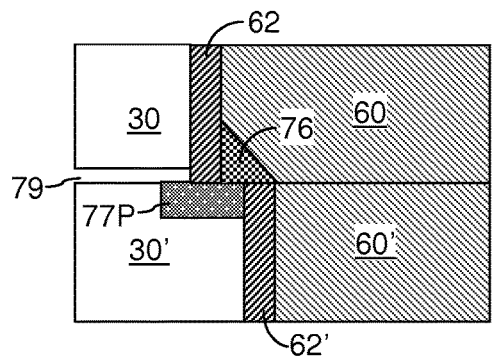
FIG. 5F is a magnified view of the region Y in the fifth bonded structure of FIG. 5D.

Referring to FIG. 5F, a magnified view of the region Y in the first bonded structure of FIG. 4C is shown. The metal silicate portion 77P can physically contact a horizontal surface of one of the metal pads a vertical stack of a first metal pad (60, 62) and a second metal pad (60', 62'), and a vertical surface of the other of the metal pads in the vertical stack. The metal pad 77P can contact a silicon oxide layer that is in physical contact with the other of the metal pads.

A cavity 79 in contact with the vertical stack of the two metal pads (60, 62, 60', 62') is present between the first substrate 100 and the second substrate 200. The metal silicate material is in physical contact with a horizontal surface of one of the first and second silicon oxide layers (30, 30'), and does not contact another of the first and second silicon oxide layers (30, 30').

Figure 5G:
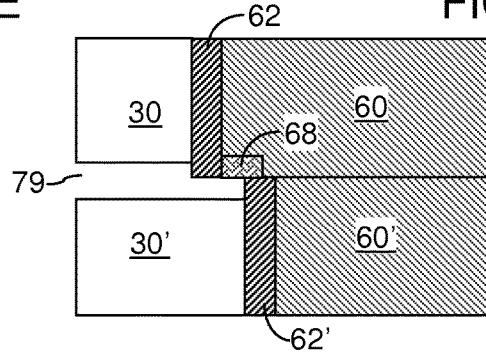
FIG. 5G is a magnified view of the region Z in the fifth bonded structure of FIG. 5D.

Referring to FIG. 5G, a magnified view of the region Z in the first bonded structure of FIG. 3D is shown. A cavity 79 is in contact with a horizontal surface of one of the metal pads in the vertical stack of a first metal pad (60, 62) and a second metal pad (60', 62'). In this case, a metal silicate portion is not formed.

Physical exposure of a horizontal surface of a first dopant metal-copper alloy portion 90 or a second dopant metal-copper alloy portion causes formation of a metal oxide portion 68 within one of the first and second metal pads (60, 62, 60', 62'). The metal oxide portion 68 can be formed within a peripheral portion of a metal pad (60, 62, 60', 62') in the vertically contacting pair that is physically exposed to the cavity 79 such that the metal oxide portion 68 includes an oxide of the dopant metal, which is a third compound including the dopant metal. Specifically, in a vertically contacting pair of metal pads (60, 62, 60', 62'), a first metal pad (60, 62) and a second metal pad (60', 62') can be bonded to each other at an interface such that a horizontal surface of one of the copper-containing pad portions (60, 60') is physically exposed to a cavity 79. The dopant metal can migrate to the physically exposed surface of the copper-containing pad portions (60 or 60') and form an oxide of the dopant metal. Each portion of the metal pad including the oxide of the dopant metal constitutes a metal oxide portion 68. The ambient during the anneal that bonds the first and second substrates (100, 200) is controlled such that the dopant metal is oxidized to form the metal oxide portions 68 while prevention conversion of copper into copper oxide. Each metal oxide portion 68 is embedded within a peripheral portion of a metal pad in the vertically contacting pair. The dopant metal is not present at a center portion of the interface between the copper-containing pad portions (60 or 60') because the dopant metal migrates toward the metallic nitride liners (62, 62'). In this case, the metal oxide portion 68 includes an oxide of a dopant metal that is not present at a portion of the interface at which copper-containing material portions (60, 60') of metal pads are bonded to each other. In one embodiment, a horizontal surface of the metal oxide portion 68 can be coplanar with the interface.

In one embodiment, each metal pad in the vertically contacting pair of metal pads (60, 62, 60', 62') can be physically exposed to a cavity 79 by which a horizontal surface of the first silicon oxide layer 30 is spaced from a horizontal surface of the second silicon oxide layer 30'. In one embodiment, the first metal pad (60, 62) in the vertically contacting pair includes a first metallic nitride liner 62, a second metal pad (60', 62') in the vertically contacting pair includes a second metallic nitride liner 62', and the metal oxide portion 68 can be in contact with the first metallic nitride liner 62 and the second metallic nitride liner 62'.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method of bonding substrates comprising:
providing a first substrate including a first metal pad predominantly embedded in a first silicon oxide layer;
providing a second substrate including a second metal pad predominantly embedded in a second silicon oxide layer;
introducing a dopant metal into surface regions of at least one of said first substrate and said second substrate, wherein said dopant metal is selected from elemental metals having a greater oxygen-affinity than copper;
bonding said first metal pad with said second metal pad, wherein a metal silicate material layer comprising said dopant metal is formed between said first silicon oxide layer and said second silicon oxide layer, said metal silicate material layer laterally surrounding said first and second metal pads and contacting a horizontal surface of said first silicon oxide layer and a horizontal surface of said second silicon oxide layer, wherein said metal silicate material layer comprises a silicate of said dopant metal, and a vertically contacting pair of said first metal pad and said second metal pad is formed within a bonded structure including said first and second substrates, and said metal silicate material layer contacts a horizontal surface of a peripheral portion of each of said first and second metal pads and a sidewall surface of each of said first and second metal pads; and
forming a dopant metal rich portion within each of said first and second metal pads underneath said horizontal surface of said peripheral portion of each of said first and second metal pads by diffusion of said dopant metal into each of said first and second metal pads.

2. The method of claim 1, wherein said first substrate further comprises a vertical stack of a first semiconductor substrate, first through substrate via structures embedded in said first semiconductor substrate and first interconnect-level dielectric layers.

3. The method of claim 1, wherein said second substrate further comprises a vertical stack of a second semiconductor substrate, second through substrate via structures embedded in said second semiconductor substrate and second interconnect-level dielectric layers.

4. The method of claim 1, wherein said first metal pad comprises a first copper-containing portion and a first metallic nitride liner laterally surrounding said first copper-containing portion, and said second metal pad comprises a second copper-containing portion and a second metallic nitride liner laterally surrounding second copper-containing portion.

5. The method of claim 4, wherein said horizontal surface of said first silicon oxide layer is located below horizontal surfaces of said first copper-containing portion and said first metallic nitride liner, and said horizontal surface of said second silicon oxide layer is located below horizontal surfaces of said second copper-containing portion and said second metallic nitride liner.

6. The method of claim 1, wherein said introducing said dopant metal into said surface regions of at least one of said first substrate and said second substrate comprises forming a metal oxide layer comprising said dopant metal over at least one of said first substrate and said second substrate, said metal oxide layer located over one of said first and second silicon oxide layers and laterally surrounding one of said first and second metal pads, wherein during said bonding, said metal oxide layer reacts with one of said first and second silicon oxide layers to form said metal silicate material layer.

7. The method of claim 6, further comprising recessing said metal oxide layer, wherein said metal oxide layer has a horizontal surface coplanar with a horizontal surface of one of said first and second metal pads.

8. The method of claim 1, wherein said introducing said dopant metal into said surface regions of at least one of said first substrate and said second substrate comprises depositing said dopant metal over one of said first and second silicon oxide layers and one of said first and second metal pads, wherein said dopant metal reacts with an upper portion of a copper-containing portion within one of said first and second metal pads to form a doped copper region within one of said first and second metal pads.

9. The method of claim 8, further comprising recessing a first copper-containing portion within said first metal pad and/or recessing a second copper-containing portion within said second metal pad prior to said depositing said dopant metal.

10. The method of claim 9, further comprising forming a first copper-containing cap over said first copper-containing portion and/or forming a second copper-containing cap over said second copper-containing portion after said depositing said dopant metal.

11. A method of bonding substrates comprising:
providing a first substrate including a first metal pad predominantly embedded in a first silicon oxide layer;
providing a second substrate including a second metal pad predominantly embedded in a second silicon oxide layer;
introducing a dopant metal into surface regions of at least one of said first substrate and said second substrate, wherein said dopant metal is selected from elemental metals having a greater oxygen-affinity than copper;
bonding said first metal pad with said second metal pad, wherein a first metal silicate material layer comprising said dopant metal is formed over a horizontal surface of said first silicon oxide layer, and a second metal silicate material layer comprising said dopant metal is formed over a horizontal surface of said second silicon oxide layer, wherein said first metal silicate material layer laterally surrounds said first metal pad, and said second metal silicate material layer laterally surrounds said second metal pad and is separated from said first metal silicate material layer by a cavity.

12. The method of claim 11, wherein said first metal silicate material layer contacts a sidewall surface of said first metal pad and a horizontal surface of a peripheral portion of said second metal pad, and said second metal silicate material layer contacts a horizontal surface of a peripheral portion of said first metal pad and a sidewall surface of said second metal pad.

13. The method of claim 12, further comprising inducing formation of a dopant metal rich portion within each of said first and second metal pads underneath said horizontal surface of said peripheral portion of each of said first and second metal pads by diffusion of said dopant metal into each of said first and second metal pads.

14. The method of claim 11, wherein an entirety of said first metal silicate material layer contacts a sidewall surface of said first metal pad, and an entirety of said second metal silicate material layer contacts a sidewall surface of said second metal pad.

15. The method of claim 11, further comprising forming a metal oxide portion within a peripheral portion of each of said first and second metal pads in said vertically contacting pair that is physically exposed to said cavity, wherein said metal oxide portion comprises an oxide of said dopant metal.

16. The method of claim 14, wherein said cavity laterally extends to a vertically contacting pair of said first metal pad and said second metal pad.

* * * * *